United States Patent
Nurioka

[11] Patent Number: 6,160,409
[45] Date of Patent: Dec. 12, 2000

[54] INSPECTION METHOD OF CONDUCTIVE PATTERNS

[75] Inventor: Akira Nurioka, Fukyama, Japan

[73] Assignee: OHT Inc., Hiroshima-ken, Japan

[21] Appl. No.: 09/186,692

[22] Filed: Nov. 6, 1998

Related U.S. Application Data

[62] Division of application No. 08/745,855, Nov. 8, 1996, abandoned.

[30] Foreign Application Priority Data

| Nov. 10, 1995 | [JP] | Japan | 7-317302 |
| Mar. 28, 1996 | [JP] | Japan | 8-104149 |
| Mar. 28, 1996 | [JP] | Japan | 8-104150 |
| Oct. 24, 1996 | [JP] | Japan | 8-282471 |

[51] Int. Cl.⁷ ............................................. G01R 15/12
[52] U.S. Cl. ................................... 324/754; 324/761
[58] Field of Search ................... 324/72.5, 754, 324/761, 537, 538, 688; 439/482, 842

[56] References Cited

U.S. PATENT DOCUMENTS

| 3,562,543 | 2/1971 | Smith . |
| 4,035,722 | 7/1977 | Ryabov et al. . |
| 4,138,643 | 2/1979 | Beck et al. . |
| 4,342,957 | 8/1982 | Russell . |
| 4,342,958 | 8/1982 | Russell . |
| 4,471,298 | 9/1984 | Frohlich . |
| 4,565,966 | 1/1986 | Burr et al. . |
| 5,003,254 | 3/1991 | Hunt et al. . |
| 5,006,808 | 4/1991 | Watts ........................................ 324/537 |
| 5,214,375 | 5/1993 | Ikeuchi et al. . |
| 5,256,975 | 10/1993 | Mellitz et al. . |
| 5,357,191 | 10/1994 | Grace . |
| 5,408,189 | 4/1995 | Swart et al. . |
| 5,420,500 | 5/1995 | Kerchner ................................. 324/72.5 |
| 5,461,323 | 10/1995 | Yanagi et al. . |
| 5,461,324 | 10/1995 | Boyette et al. . |
| 5,467,020 | 11/1995 | Boyette, Jr. et al. . |
| 5,596,283 | 1/1997 | Mellitz et al. . |

OTHER PUBLICATIONS

Patent Abstracts of Japan, vol. 014, No. 136, Mar. 14, 1990, Abstract No. 02–002946.
Patent Abstracts of Japan, vol. 014, No. 430, Sep. 14, 1990, Abstract No. 02–168164.
Patent Abstracts of Japan, vol. 015, No. 312, Aug. 9, 1991, Abstract No. 03–113375.
Patent Abstracts of Japan, vol. 096, No. 011, Nov. 29, 1996, Abstract No. 08–189939.

*Primary Examiner*—Vinh P. Nguyen
*Attorney, Agent, or Firm*—Burns, Doane, Swecker & Mathis, LLP

[57] ABSTRACT

An inspection apparatus inspects an electronic circuit board on which a plurality of bonding pads and a plurality of pin pads are connected to each other through conductive patterns. A probe having a contact pin is moved on the electronic circuit board along a straight line substantially constituted by a terminal group without separating the contact pin from the surface of the electronic circuit board. This moving operation is a "wiping" operation. In the process of movement, an identifiable electrical signal is applied to the contact pin, and a return signal is detected at each pin pad. This return signal is compared with a reference signal obtained in advance by using a reference circuit board. A discontinuity or short in each conductive pattern is determined on the basis of the comparison result.

18 Claims, 28 Drawing Sheets

| TIME | PD1 | PD2 | PD3 |
|---|---|---|---|
| $t_1$ | 0 | 0 | 0 |
| $t_2$ | 1 | 0 | 0 |
| $t_3$ | 1 | 0 | 0 |
| $t_4$ | 1 | 0 | 0 |
| $t_5$ | 1 | 0 | 0 |
| $t_6$ | 0 | 0 | 0 |
| $t_7$ | 0 | 1 | 0 |
| $t_8$ | 0 | 1 | 0 |

| INPUT BP | SAMPLED PP (SHORT) | SAMPLED PP (DISCONTINUITY) |
|---|---|---|
| BP1 | PP3, PP4 | PP1, PP2 |
| BP2 | PP1, PP2, PP4 | PP3 |
| BP3 | PP3, PP4 | PP1, PP2 |
| BP4 | PP1, PP2, PP3 | PP4 |

800 801

INSPECTION METHOD OF CONDUCTIVE PATTERNS

This application is a divisional, of application Ser. No. 08/745,855, filed Nov. 8, 1996, now abandoned.

BACKGROUND OF THE INVENTION

The present invention relates to an inspection apparatus, an inspection method, and an inspection probe for a work (to be referred to as an electronic circuit board) having conductive patterns with narrow spacings, e.g., an electronic circuit having a pin grid array (PGA) structure or a multi-layered circuit board.

As the packing densities of electronic circuits such as ICs increase, the interconnections of electronic circuit boards are formed into highly integrated and multilevel metallization.

FIG. 1 shows a PGA package 100 as an electronic circuit board.

The PGA package 100 in FIG. 1 is at the stage before an LSI chip 105 mounted in the center of the package is bonded with lead wires. The LSI chip 105 is bonded to bonding pads (to be referred to as "BPs" hereinafter) 102 on a multi-layered ceramic board 104 with predetermined lead wires. As shown in FIG. 2, in the multi-layered ceramic board 104 of the PGA package 100, a given BP 102 is wired to a specific pin pad (to be referred to as a "PP" hereinafter) 101 through a lead wire 103. This lead wire 103 must not be short-circuited to another lead wire or have a discontinuity.

The inspection apparatus of the present invention is designed to check discontinuities and shorts in an electronic circuit board such as a PGA package like the one shown in FIGS. 1 and 2, especially in interconnections which are not seen from the outside.

In a PGA package (or LCC (Leadless Chip Carrier) package or the like), in particular, since the pitch of the BPs 102 is very small, it is difficult to specify a pad.

In a conventional inspection method and apparatus, a pair of connection pins for power supply and reception are brought into contact with electrodes to be inspected (e.g., the lands of a BP and a corresponding PP), and an electrical signal is supplied to one of the pins to inspect whether a predetermined signal is output from the electrode (or electrodes) for power reception. In order to reliably perform this inspection, an apparatus for accurately positioning pins on lands is required.

When the interconnection pitch of a circuit pattern is small, the pins can be easily and accurately positioned on lands. As the interconnection pitch decreases, the number of input/output points (measurement count) for a test increases, stricter positioning conditions are imposed on the test. For this reason, complicated, high-precision inspection jigs are required, resulting in an increase in cost.

In general, electronic circuit boards such as PGA packages respectively have different bonding pad patterns.

In a conventional method (e.g., disclosed in U.S. Pat. No. 4,035,722, which will be referred to as a "multi-probe method" for the sake of descriptive convenience), a high-precision probe head corresponding to the bonding pad and pin pad patterns of each PGA package is manufactured, and the head is brought into contact with the lands of the pin pads and the lands of the bonding pads at once to measure continuity between the lands. This multi-probe method allows a batch test of many pins with a high precision. However, a test head for a given board or package cannot be used for other boards or packages. Therefore, a head dedicated to each board or package is required, resulting in a high cost.

As an improvement on the multi-probe method, a moving probe method (e.g., U.S. Pat. No. 5,256,975) is known. In this method, one probe comes into contact with an electrode group (i.e., a pad group) to be inspected in units of lands.

The above multi-probe method and the moving probe method have their own advantages and disadvantages in terms of throughput including test speeds, the contact characteristics of probes, and costs. However, both the methods require high-precision positioning. High-precision positioning generally leads to structural or mechanical limitations. For example, the use of a probe head (multi-probe method) having contact pins with a small pitch makes it difficult to perform positioning with respect to a work. In the moving probe method, since positioning is performed in units of lands, it takes much time to perform an inspection.

In both the multi-probe method and the moving probe method, if the dimensional precision of a package to be inspected is high, positioning poses no serious problems.

However, in an IC package having a PGA structure, in particular, since the multi-layered ceramic board 104 undergoes a large change in dimension, the dimensions of the finished BPs 102 having a high wiring density inevitably vary. From the viewpoint of a work, positioning is very difficult to perform in a contact type inspection. That is, the errors between the head and the BP pattern are too large to perform an inspection by the multi-probe method. In the moving probe method as well, owing to the above variation, it is difficult to accurately position the probe pins.

Furthermore, in the moving probe method, the probe pins must be brought into contact with lands or patterns, resulting in undesired flaws.

SUMMARY OF THE INVENTION

The present invention has been made in consideration of the above situations, and has as its object to provide an inspection apparatus and method which inspect discontinuities and shorts (insufficient insulation) in a plurality of conductive patterns formed on or in an electronic circuit board with a small number of probes.

In an inspection apparatus and method of the present invention, a small number of probes (e.g., one probe) is caused to "trace" the surface of an electronic circuit board. With this operation, even if terminals are unevenly arranged on a board, contact of the probe with a terminal can be accurately recognized. In order to make the probe trace the surface of the electronic circuit board, the probe or the board may be moved relative to each other. That is, either the probe or the electronic circuit board is moved along a straight line substantially constituted by a plurality of terminals formed on the electronic circuit board while a contact pin mounted on the probe is not separated from the surface of the electronic circuit board.

Accordingly, in order to achieve the above object according to the present invention, there is provided an inspection apparatus for determining qualities of a plurality of conductive patterns on an electronic circuit board having a first group of plural terminals, a second group of plural terminals, and the plurality of conductive patterns for electrically connecting the first group of plural terminals to the second group of plural terminals, comprising: a first probe having a first contact pin which comes in contact with the electronic circuit board; moving means for moving one of said first probe and the electronic circuit board along a straight line substantially constituted by the first group of plural terminals without separating the first contact pin from a surface of the electronic circuit board; supply means for supplying a first identifiable electrical signal to the first contact pin of said first probe; monitor means for monitoring a second electrical signal appearing at each terminal of the second group of plural terminals; and determination means for determining qualities of the plurality of conductive patterns on the basis of the monitor result obtained by said monitor means.

In order to achieve the object, there is also provided according to the present invention, an inspection method of determining qualities of a plurality of conductive patterns on an electronic circuit board by applying a first identifiable electrical signal thereto through a first probe, the electronic circuit board having a first group of plural terminals, a second group of plural terminals, and the plurality of conductive patterns for electrically connecting the first group of plural terminals to the second group of plural terminals, comprising: the moving step of supplying the first identifiable electrical signal to said probe while moving said probe along a straight line substantially constituted by the first group of plural terminals without separating a distal end of said probe from a surface of the electronic circuit board; the monitor step of monitoring a second electrical signal appearing at each terminal of the second group of plural terminals while said probe is supplying the electrical signal to one terminal of the first group; and the determination step of determining qualities of the plurality of conductive patterns on the basis of the second electrical signal obtained in the monitor step.

In addition, by tracing the board surface with the probe, the positions of the terminals formed on the board can be detected, that is another object of the present invention The other object of the present invention is achieved by the apparatus, wherein said determination means comprises identifying means for identifying a terminal, of the first group of plural terminals, to which the first electrical signal is supplied from said supply means, on the basis of the monitor result obtained by said monitor means, and determines a quality of a conductive pattern on the basis of the second electrical signal detected by said monitor means at one or a plurality of terminals of the second group which are connected to the terminal identified by said identifying means through conductive patterns.

The other object is also achieved by the method wherein the determination step comprises: the identifying step of identifying a terminal, of the first group of plural terminals, to which the first electrical signal is supplied, on the basis of the monitor result obtained in the monitor step; and the step of determining a quality of a conductive pattern on the basis of the second electrical signal detected in the monitor step at one or a plurality of terminals of the second group which are connected to the terminal identified in the identifying step through conductive patterns.

The positions of the terminals formed on the board can also be known from the connection relationship between conductive patterns. For example, the conductive patterns connect bonding pads (first group terminals) to pin pads (second group terminals). If data indicating the connection relationship between the first group terminals and the second group terminals is stored, it can be selectively determined whether a second electrical signal is detected or not detected at a specific terminal of the second group terminals. This selective determination, which is a further object of the present invention, is achieved by the apparatus, further comprising first storage means for storing data indicating a connection relationship between the first group of plural terminals and the second group of plural terminals through the plurality of conductive patterns, and wherein when the first contact pin of said first probe is moved onto one terminal of the first group by said moving means, said determination means specifies a terminal, of the second group, which is connected to said one terminal, on the basis of said storage means, and determines a quality of a conductive pattern between said one terminal and the specified terminal on the basis of the second electrical signal detected through said detection means.

The further object above is also achieved by the method further comprising the storage step of storing data in a predetermined memory, the data indicating a connection relationship between the first group of plural terminals and the second group of plural terminals through the plurality of conductive patterns, and wherein the determination step comprises, when the first contact pin of said first probe is moved onto one terminal of the first group in the moving step, specifying a terminal, of the second group, which is connected to the one terminal, on the basis of the predetermined memory, and determining a quality of a conductive pattern between said one terminal and the specified terminal on the basis of the second electrical signal detected in the monitor step.

The positions of the first group terminals can be identified more accurately by using a probe having two adjacent contact pins. When an electrical signal is applied to one contact pin while the probe is on a terminal, the signal should appear at the other contact pin. Detection of the signal at the other contact pin, that is a yet further object of the present invention, indicates that the probe is on the terminal.

The yet further object of the present invention is achieved by the apparatus further comprising a second probe having a second contact pin mounted at a position near the first contact pin of said first probe, and wherein said identifying means identifies a terminal of the first group to which the first electrical signal is being supplied from said first probe through the first contact pin, on the basis of a third electrical signal detected through the second contact pin of said second probe.

The yet further object above is also achieved by the method according to claim 1, wherein the moving step comprises using a second probe having a second contact pin mounted at a position near the first contact pin of said first probe in addition to said first probe, and the identifying step comprises identifying a given terminal, of the first group, to which the first electrical signal is supplied from said first probe through the first contact pin, on the basis of a third electrical signal detected through the second contact pin of said second probe.

When the present invention is to use two contact pins, the distance between the two pins is preferably set to be less than the width of one terminal.

According to a preferred aspect of the present invention, a first group terminal to which an electrical signal is applied is preferably identified on the basis of an elapsed time from the start point of an inspection.

The contact pin is inclined with respect to the probe body to facilitate a wiping operation. If the pin is inclined, the probe must be rotated in accordance with a change in the moving direction of the probe. According to another preferred aspect of the present invention, the moving means further includes a motor for rotating the first probe about its axis.

According to still another preferred aspect of the present invention, the first probe is moved at a known velocity, preferably a constant velocity. The position of each first group terminal can be easily discriminated.

In order to accurately recognize terminal positions on an electronic circuit board as a work on which terminals are unevenly arranged, a "reference work", which is a further aspect of the present invention is preferably used.

According to the further aspect of the present invention provides, the apparatus further comprises means for moving said first probe on a reference substrate having terminals and conductive patterns corresponding to the electronic circuit board at the known velocity; and second storage means for storing an electrical signal appearing at the second group of plural terminals as reference signal data in a process in which said first probe is moved on the reference substrate, and wherein said determination means compares the second electrical signal obtained by said second monitor means with reference signal data read out from said second storage means.

According to the further aspect, the method further comprises the step of moving said first probe on a reference substrate having terminals and conductive patterns corresponding to the electronic circuit board at the known velocity; and the step of storing an electrical signal appearing at the second group of plural terminals as reference signal data in a predetermined second memory in a process in which said first probe is moved on the reference substrate, and wherein the second electrical signal obtained in the second monitor step is compared with reference signal data read out from said second memory.

In order to detect faults in an electronic circuit board as a work while comparing it with a reference substrate, corresponding data must be discriminated from reference signal data. Accordingly, the present invention provides the apparatus and method wherein said determination means and step retrieves target reference signal data from said second storage means in accordance with an elapsed time.

Faults in conductive patterns include shorts between interconnections and discontinuities therein. These faults must be discriminated and determined. This operation, which is a yet further aspect of the present invention, is performed by using the stored data indicating the connection relationship between the first and second group terminals. According to the apparatus and method according to the above aspect, said determination means/step detects that the first contact pin of said first probe is in contact with one terminal of the first group; specifies a first terminal connected to said one terminal of the second group, and a second terminal which is not connected to said one terminal on the basis of the data indicating the connection relationship; determines a discontinuity in a conductive pattern between said one terminal and the first terminal on the basis of the second electrical signal detected at the first terminal; and determines a short in a conductive pattern between said one terminal and the second terminal on the basis of the second electrical signal detected at the second terminal.

According to still preferred aspect of the present invention, an electrical signal applied to a terminal through the probe has a known voltage value or a know repetitive pattern. This makes the signal identifiable.

It is another object of the present invention to provide an inspection probe suitably used to perform a wiping operation in inspecting an electronic circuit board.

In order to achieve this object, according to the present invention, there is provided an inspection probe for inspecting an electronic circuit board, comprising: an electrical insulating cylinder having first and second signal terminals for inputting signals; first and second conductive pistons which slidably move in said cylinder and are electrically insulated from each other; first suspension means having one end connected to one of the pair of signal terminals, and the other end connected to a portion of said first conductive piston, thereby allowing said first conductive piston to be elastically suspended from said cylinder; second suspension means having one end connected to the other of the pair of signal terminals, and the other terminal connected to a portion of said second conductive piston, thereby allowing said second conductive piston to be elastically suspended from said cylinder; a first contact pin which is mounted on said first conductive piston to come in contact with a surface of the electronic circuit board; and a second contact pin which is mounted on said second conductive piston to come in contact with the surface of the electronic circuit board at a predetermined distance from the first contact pin..

It is still another object of the present invention to provide a probe which is suitably used to perform a wiping operation in inspecting an electronic circuit board, and can accurately detect the position of a terminal to be recognized.

In order to achieve this object, according to the present invention, there is provided an inspection probe used to inspect an electronic circuit board, comprising: an electrical insulating cylinder having a signal terminal for inputting a signal; a conductive piston which slidably moves in said cylinder; conductive suspension means having one end connected to the signal terminal, and the other end connected to a portion of said conductive piston, thereby allowing said conductive piston to be elastically suspended from said cylinder; and a first contact pin mounted on said conductive piston to come in contact with a surface of the electronic circuit board.

According to still another preferred aspect of the present invention, the contact pin is inclined with respect to the sliding direction of the piston and mounted thereon.

According to still another preferred aspect of the present invention, the contact pin is suspended by a coil-like wire.

According to still another preferred aspect of the present invention, the distance between the first and second contact pins is set to be less than the width of a conductive pattern (to be inspected) formed on the electronic circuit board.

According to still another preferred aspect of the present invention, the first and second contact pins are arranged side by side in the moving direction of the inspection probe.

It is still another object of the present invention to provide an inspection method of searching for the positions of a plurality of terminals formed on an electronic circuit board.

In order to achieve this object, according to the present invention, there is provided n inspection method of inspecting an electronic circuit board by searching for positions of a plurality of terminals formed on the electronic circuit board, comprising: the contact step of bringing first and second contact pins mounted on a probe at a predetermined distance from each other into contact with a surface of the electronic circuit board; the moving step of moving said probe on the electronic circuit board along a direction substantially parallel to the surface of the electronic circuit board while keeping the two contact pins in contact with the surface; the detection step of applying an identifiable electrical signal to the first contact pin and at the same time, detecting a return signal of the electrical signal through the second contact pin in a process in which said probe is moved on the electronic circuit board; and the identifying step of identifying positions of the plurality of terminals on the basis of detected return signals.

In many instances, terminals are formed in a substantially straight line on an electronic circuit board. According to still another preferred aspect of the present invention, the first terminal of a plurality of terminals is specified, and a direction which substantially coincides with the arranging direction of the plurality of terminals is determined as a moving direction on the basis of the specified start terminal.

According to still another preferred aspect of the present invention, a terminal to which an electrical signal is applied is identified by comparing an electrical signal applied to the first terminal at a given time point with a return signal detected at the second terminal at the given time point.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 10 is a view for explaining the storage form of signals PD detected in the first embodiment;

DETAILED DESCRIPTION OF THE PREFERRED EMBODIMENTS

The three preferred embodiments of the present invention will be described below with reference to the accompanying drawings. What these embodiments have in common is that they use a wiping method. In this case, the wiping method is a method of moving a probe without separating the distal end of the probe from the surface of an electronic circuit board while supplying an identifiable electrical signal (e.g., a signal having a known DC voltage value or a signal having a voltage value with a known pattern) to the distal end of the probe. Every time the distal end of the probe comes into contact with one of the pads formed on the surface of the electronic circuit board in the process of wiping (moving) the probe, an electrical signal is transferred to the pad. By monitoring electrical signals transferred to pads, it can be determined that the distal end of the probe comes into contact with them. Even if, therefore, the positions of the pads on the electronic circuit board are not known, the positions of the pads can be accurately traced by wiping the probe on the surface of the electronic circuit board. For this reason, this method is called the wiping method.

The first embodiment proposes an inspection apparatus based on a basic wiping method in which one pin is mounted on the distal end of a probe. The second embodiment proposes a wiping method in which two pins are mounted on the distal end of a probe to accurately recognize the timing at which the distal end of the probe comes into contact with a pad as compared with the inspection apparatus of the first embodiment. The third embodiment is characterized in that discontinuities between the interconnections on an electronic circuit and insufficient insulation between the interconnections are determined by one wiping operation.

First Embodiment

Figure 1:
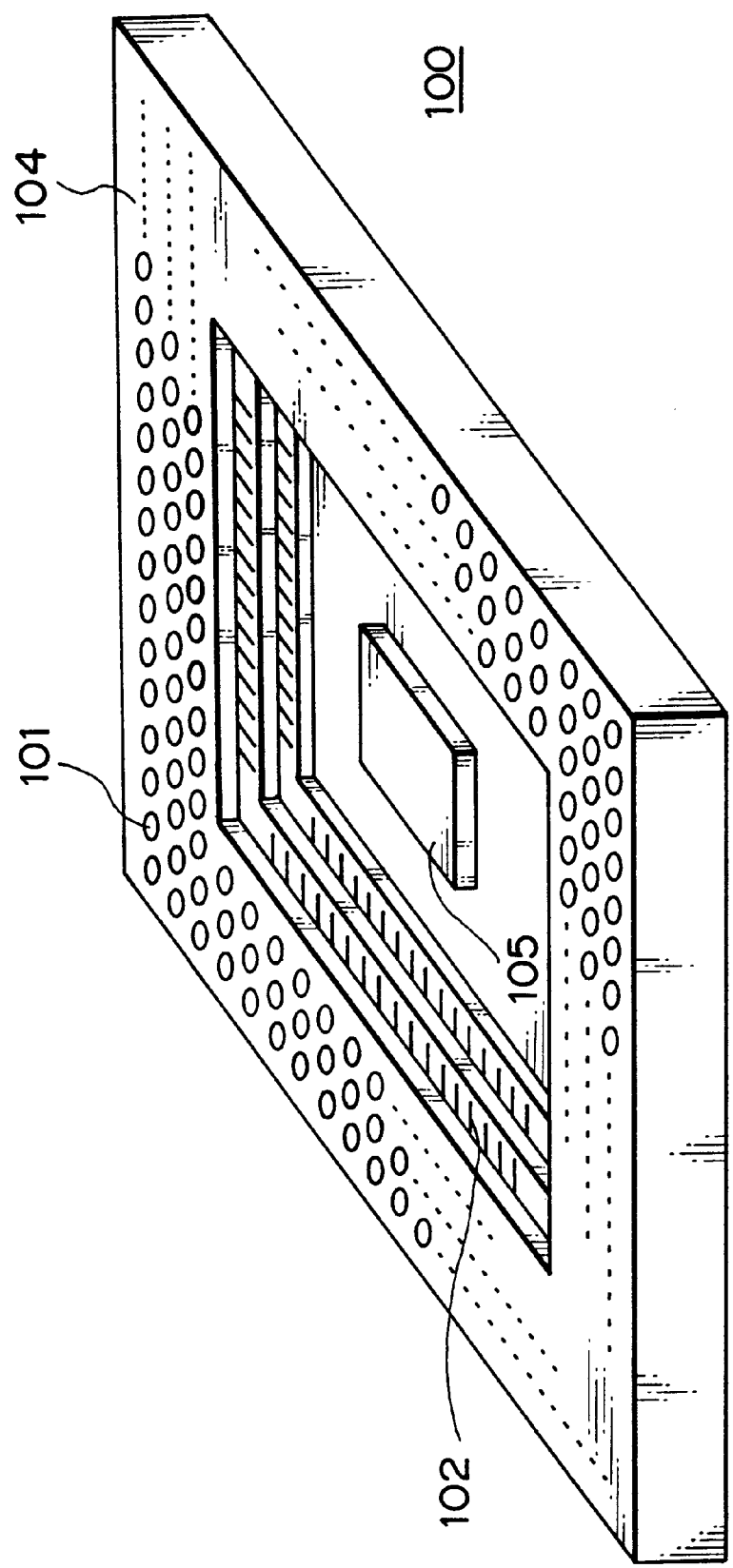
FIG. 1 is a perspective view showing a PGA package as an electronic circuit board to which the present invention is applied.
Figure 2:
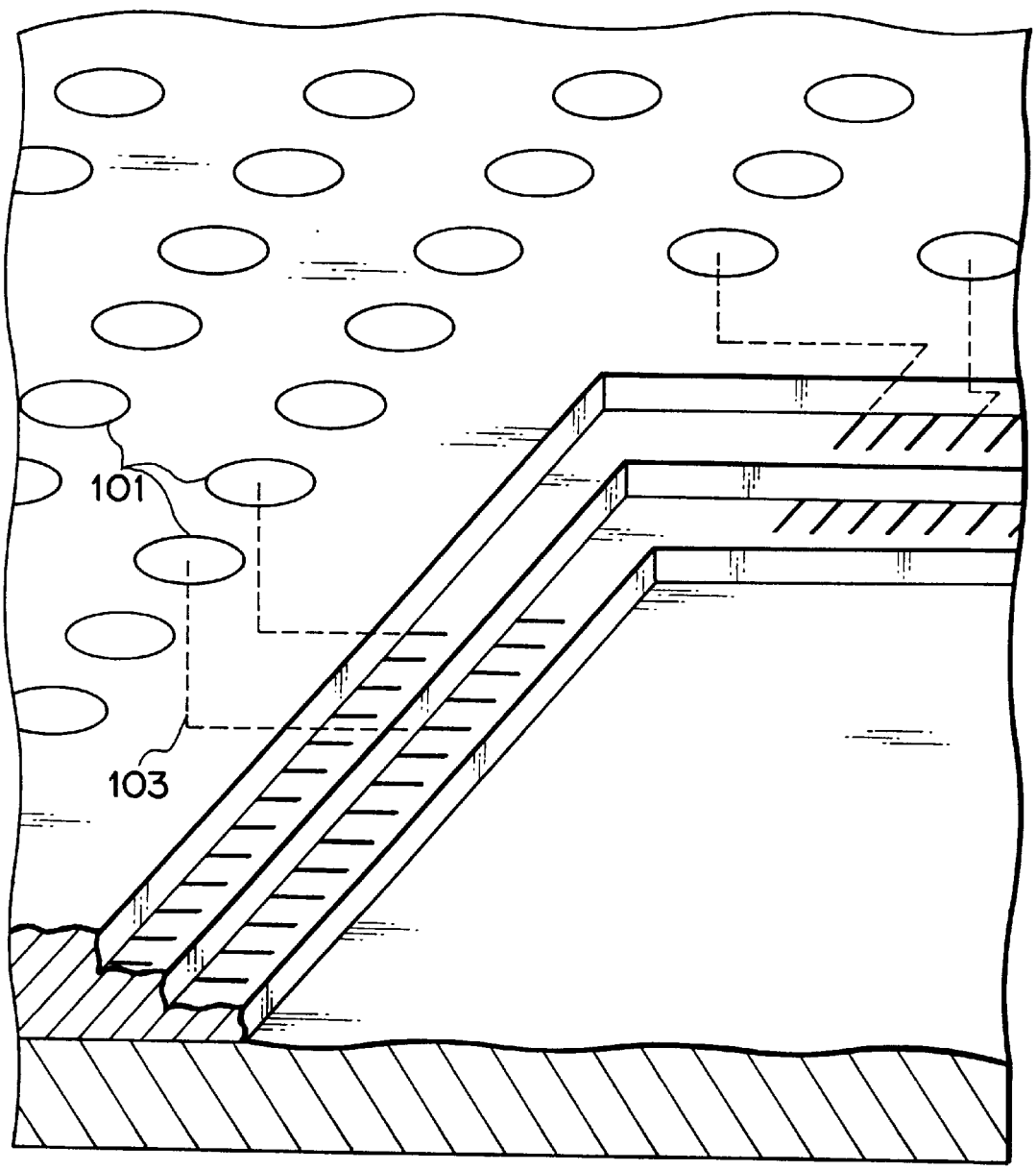
FIG. 2 is an enlarged partial view of the package in FIG. 1.
Figure 3:
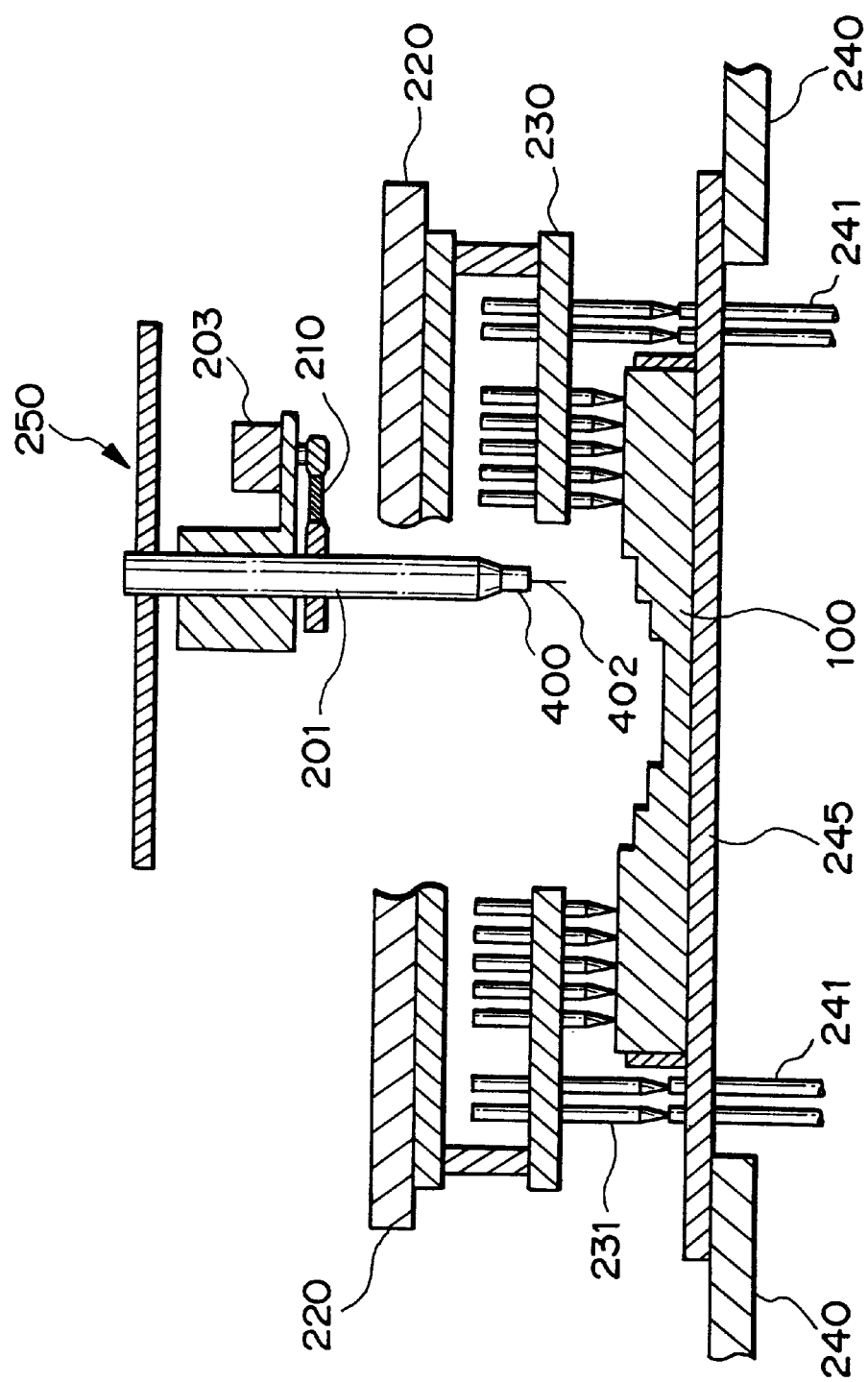
FIG. 3 is a view showing the overall arrangement of an inspection apparatus system according to the first embodiment of the present invention.

FIG. 3 shows the arrangement of the mechanical portion of an inspection apparatus for inspecting PGA packages, to which the present invention is applied.

Referring to FIG. 3, reference numeral 100 denotes a PGA package; 240, a base for the overall apparatus; and 220, an upper base. An X-Y stage 250 is mounted on the upper base 220. The upper base 220 can move vertically with respect to the lower base 240.

A lower pin board 245 is placed on the lower base 240, and an upper pin board 230 is mounted on the upper base 220. The PGA package 100 to be inspected is fixed between the upper pin board 230 and the lower pin board 245. That is, a plurality of press pins 231 extend downward from the upper pin board 230, and a plurality of press pins 241 extend upward from the lower pin board 245. The package 100 is clamped and fixed between the press pins 231 and 241. Since the press pins 231 mounted on the upper pin board 230 are extendable, the press pins 231 extend/contract in accordance with the shape of the package 100 to fix it. Note that the position of each press pin 231 on the upper pin board 230 coincides with the position of a corresponding PP 101 on the package 100. For this reason, by connecting signal extraction lines to specific pins 231, signals on the lands of the respective PPs can be extracted.

As is apparent, by making arbitrary press pins (e.g., the pins 241 mounted on the board 245) extendable, the press pins can be brought into contact with PPs regardless of the shape of a work.

The X-Y stage 250 is fixed with respect to the base 240. A Z-axis motor 203 is fixed to the X-Y stage 250. The X-Y stage 250 moves a hand 201 in the X, Y, and Z (vertical) directions. When the upper base 220 moves vertically, the X-Y stage doe not have changes in positions.

A probe unit 400 is mounted on the distal end of the hand 201. When the hand 201 is rotated by a θ-axis motor 202 through a belt 210, the probe unit 400 is rotated about the θ-axis.

As will be described later, a contact pin 402 is mounted on the distal end of the probe unit 400. This contact pin 402 traces each BP of a bonding pad portion along a ceramic board.

Figure 4:
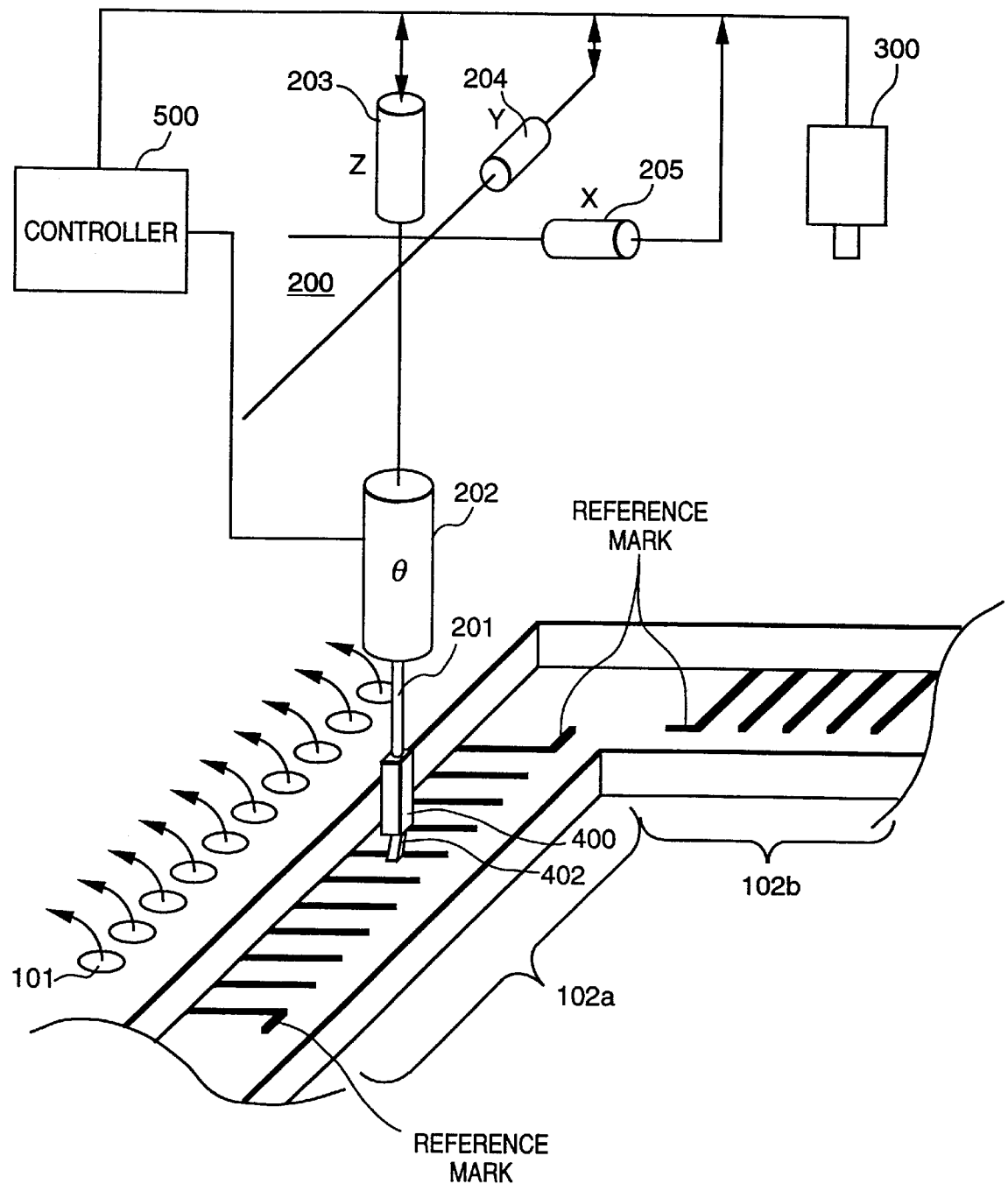
FIG. 4 is an enlarged partial view of the inspection apparatus system of the first embodiment.

FIG. 4 shows the positional relationship between the probe unit 400 mounted on the distal end of the hand 201 and the PPs 101 and PBs 102 on the package 100.

Referring to FIG. 4, for the sake of descriptive convenience, the X- and Y-axes are set to be parallel to two sides of the package 100. The Z-axis is therefore set on the upper surface of the package 100 in the vertical direction. As shown in FIG. 3, signals on the PPs 101 are extracted by using the press pins 231. In FIG. 4, however, for the sake of descriptive convenience, these signals are extracted through lead wires.

Referring to FIG. 4, BPs 102 include a plurality of pad groups 102a and 102b extending in the X and Y directions. Each pad group has a pad having a marker (e.g., an "L"-shaped marker) indicating the start of the pad group. A controller 500 detects the position of a marker among images sensed by a camera 300 by pattern recognition. The controller 500 controls the camera 300, the motor 202, and motors 203, 204, and 205.

Upon detection of a marker position, the controller 500 moves the probe unit 400 to a position above the marker position. The Z-axis motor 203 is then rotated to lower the probe unit 400 toward the marker so as to bring the probe unit 400 into contact with the BP 102. A "wiping operation" is started.

Figure 5:
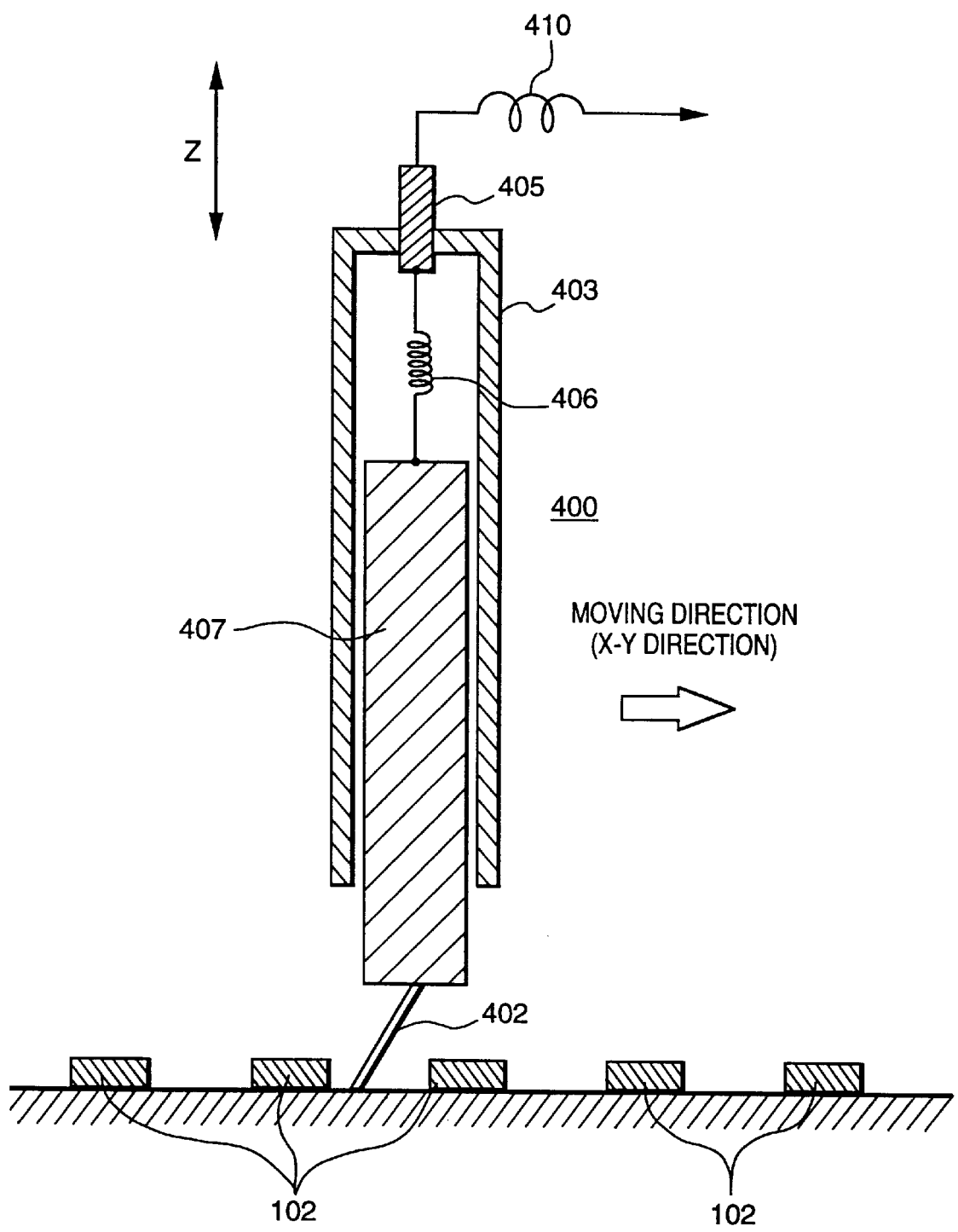
FIG. 5 is a sectional view showing the structure of an inspection probe used in the inspection apparatus of the first embodiment.

FIG. 5 shows the detailed arrangement of the probe unit 400 according to the first embodiment.

In order to perform a wiping operation, the probe of the present invention needs to trace the surface of the package 100 while faithfully following the shape of the surface. The probe unit 400 in the first embodiment shown in FIG. 5 has an arrangement for realizing a faithful wiping operation.

The probe unit 400 is constituted by a cylinder 403 (having a total length of, e.g., 80 mm) consisting of a resin (having electrical insulating property), a stainless steel piston 407 which is slidably movable in the cylinder 403, a super-steel probe pin 402 (having a length of, e.g., 3 mm) soldered to the distal end of the piston 407, a terminal 405 mounted on the upper end of the cylinder 403, and a tungsten coil 406 which is fixed to the terminal 405 and the piston 407, and from which the piston 407 is suspended. The contact pin 402 is fitted and fixed in a groove (not shown) obliquely formed in the lower portion of the cylinder 403 by soldering.

A lead wire 410 is connected to a predetermined power supply (to be described later). The contact pin 402, the piston 407, the coil 406, and the terminal 405 are all conductive. The cylinder 403 is insulated. For this reason, while the contact pin 402 is in contact with one BP 102, the lead wire 410 attached to the terminal 405 is electrically connected to the BP 102.

Although the surface which the contact pin 402 traces is slightly uneven, since the piston 407 is suspended from the coil 406 and freely moves in the vertical direction in accordance with its weight, the contact pin 402 can faithfully trace the surface of the board. A wire for electrically connecting the piston 407 and the terminal 405 constitutes the coil 406. When the piston 407 moves vertically, the coil 406 freely extends/contracts in the vertical direction. Since the repulsion produced when a linear wire bends is smaller than that produced when a coil-like wire extends/contracts, the biasing force of the coil 406 itself does not act as a load on the contact pin 402. With this operation, the contact pin 402 can trace a plurality of BPs while maintaining a good conductive state without imposing any excessive load to the PBs 102.

As shown in FIG. 5, the inspection pin 402 of the probe unit 400 is inclined with respect to the moving direction. With this inclination, the movement of the contact pin 402 on the sliding surface is made smoother. In addition, the follow-up characteristics of the contact pin 402 with respect to the uneven surface on the sliding surface in the vertical direction improve.

Figure 6:
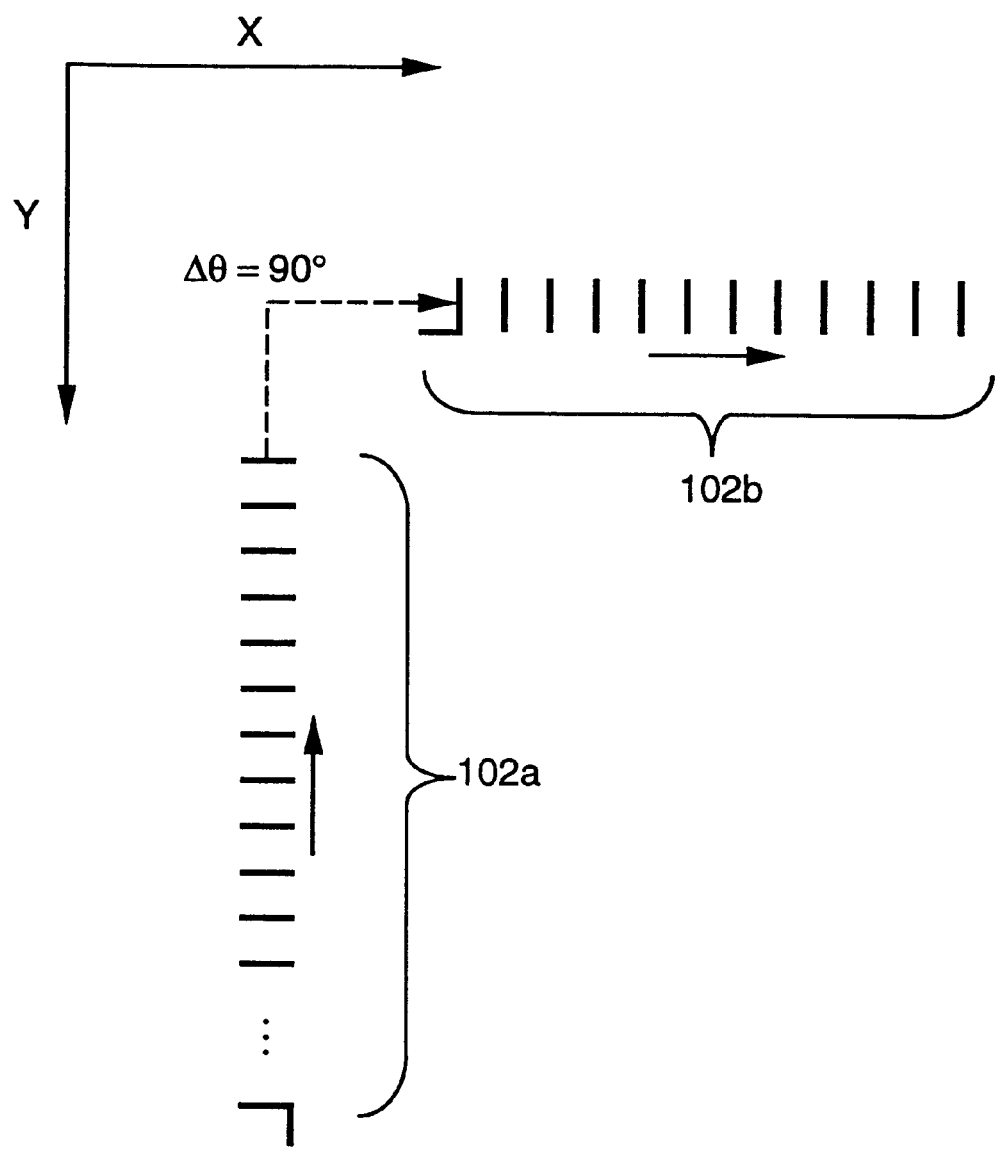
FIG. 6 is a view showing the locus of the probe when each of the inspection apparatuses of the first to third embodiments of the present invention performs an inspection.

As described above, the contact pin 402 must be inclined with respect to the moving direction of the probe unit 400. For this reason, for example, as shown in FIG. 6, when the BP group 102 is to be traced first, the θ-axis motor 202 is rotated through 90° after the group 102a is traced, and the inclination of contact pin 402 is matched with the extending direction of the BP group 102b. That is, a BP group extending in an arbitrary direction can be traced without imposing any load on the pin 402 by making the probe unit 400 rotatable about the θ-axis.

Figure 7:
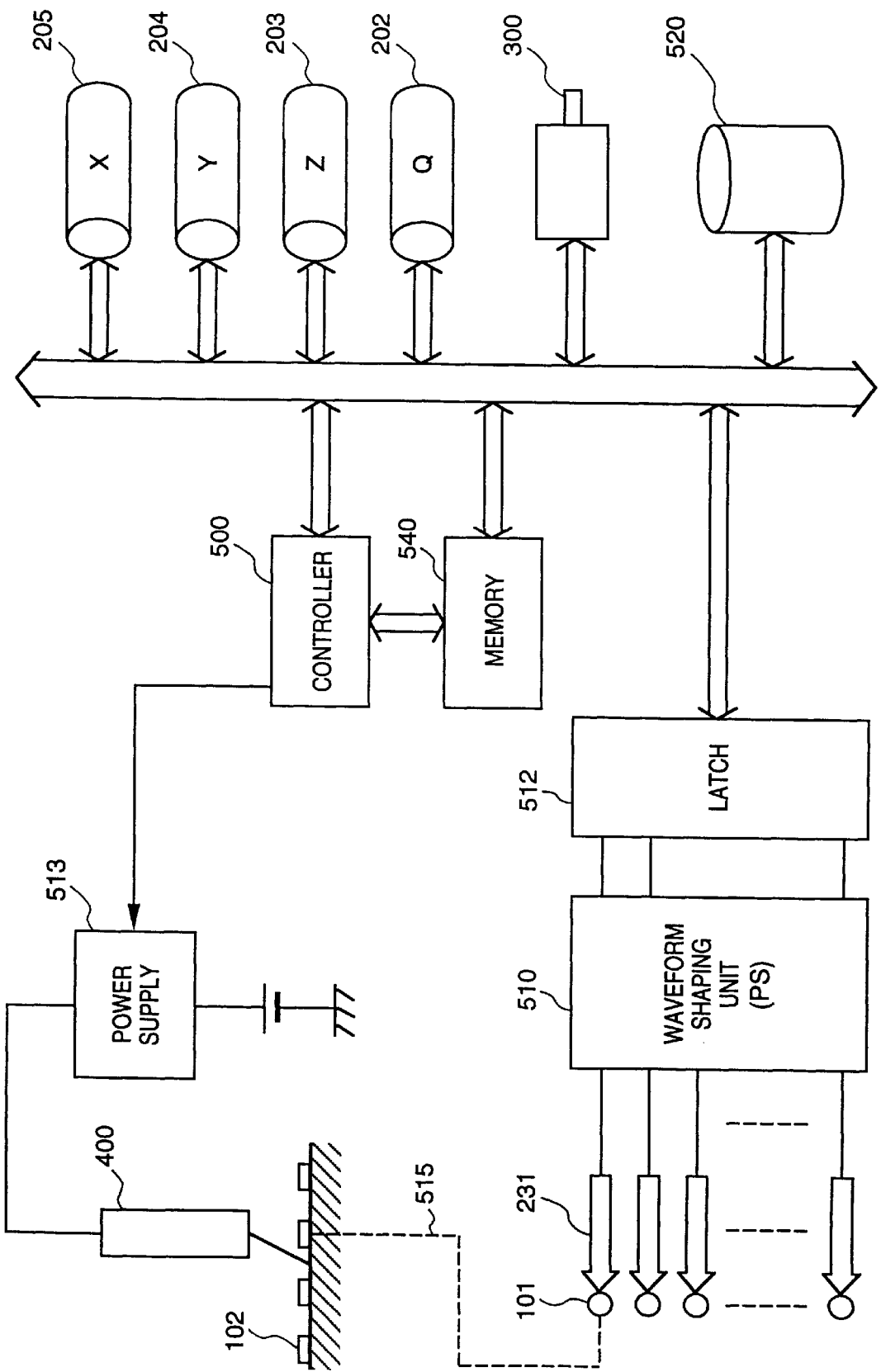
FIG. 7 is a block diagram showing the arrangement of a control system in the inspection apparatus of the first embodiment.

FIG. 7 shows the overall signal processing system of this inspection apparatus.

The controller 500 is the main part of the signal processing system and executes predetermined control operations in accordance with control programs (e.g., the control procedures shown in the flow charts of FIGS. 13 and 17) in a memory 540.

Referring to FIG. 7, reference numeral 513 denotes a current source. The controller 500 controls the current source 513 to supply a current to the pin 402 of the probe unit 400. As described above, with this operation, a predetermined voltage is applied to the BP 102 with which the pin 402 comes into contact.

Referring to FIG. 7, when the BP 102 is connected to the PP 101 through an interconnection 515 (indicated by the dotted line) within the ceramic portion, the voltage applied to the BP 102 appears at the PP 101.

As described with reference to FIG. 3, the press pins 231 are respectively in contact with the PPs 101. Since a lead wire is connected to the distal end of each press pin 231, a signal detected at the press pin 231 is shaped by a waveform shaping unit (PS) 510. The shaped signal is latched by a latch 512.

Referring to FIG. 7, reference numeral 520 denotes a disk memory. The disk memory 520 serves to store a signal (to be referred to as a reference signal hereinafter) from the PP 101 which is obtained when a reference PGA package is traced.

The principle of detection of discontinuities and shorts by means of the inspection apparatus of the first embodiment will be described with reference to FIGS. 8 and 9, taking a case wherein a wiping inspection is performed by using a package 100 having seven PPs (i to vii) and six BPs (a to f), as an example.

Figure 8:
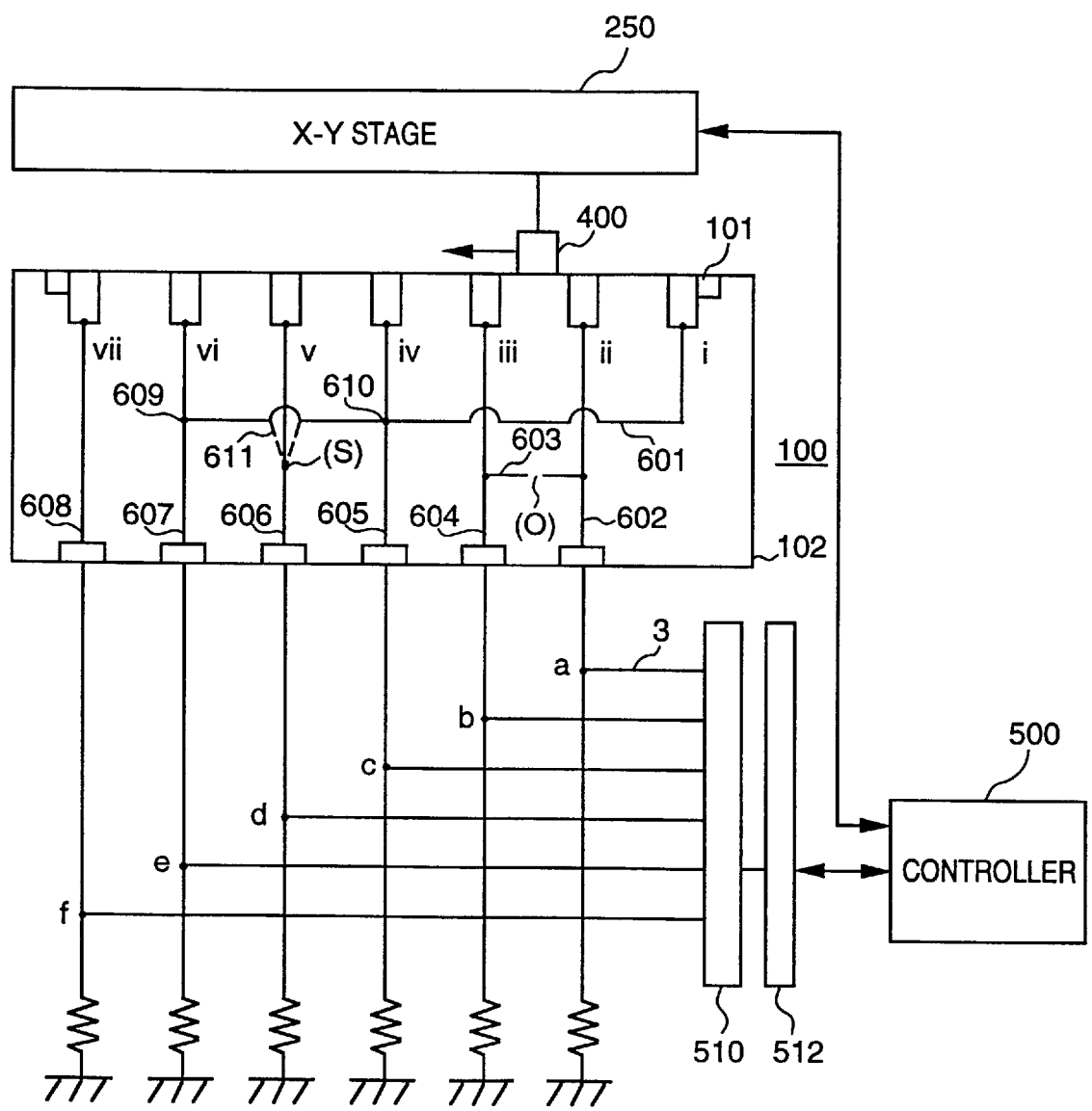
FIG. 8 is a view showing the connection relationship between the apparatus of the first embodiment and a PGA package to be inspected.
Figure 9:
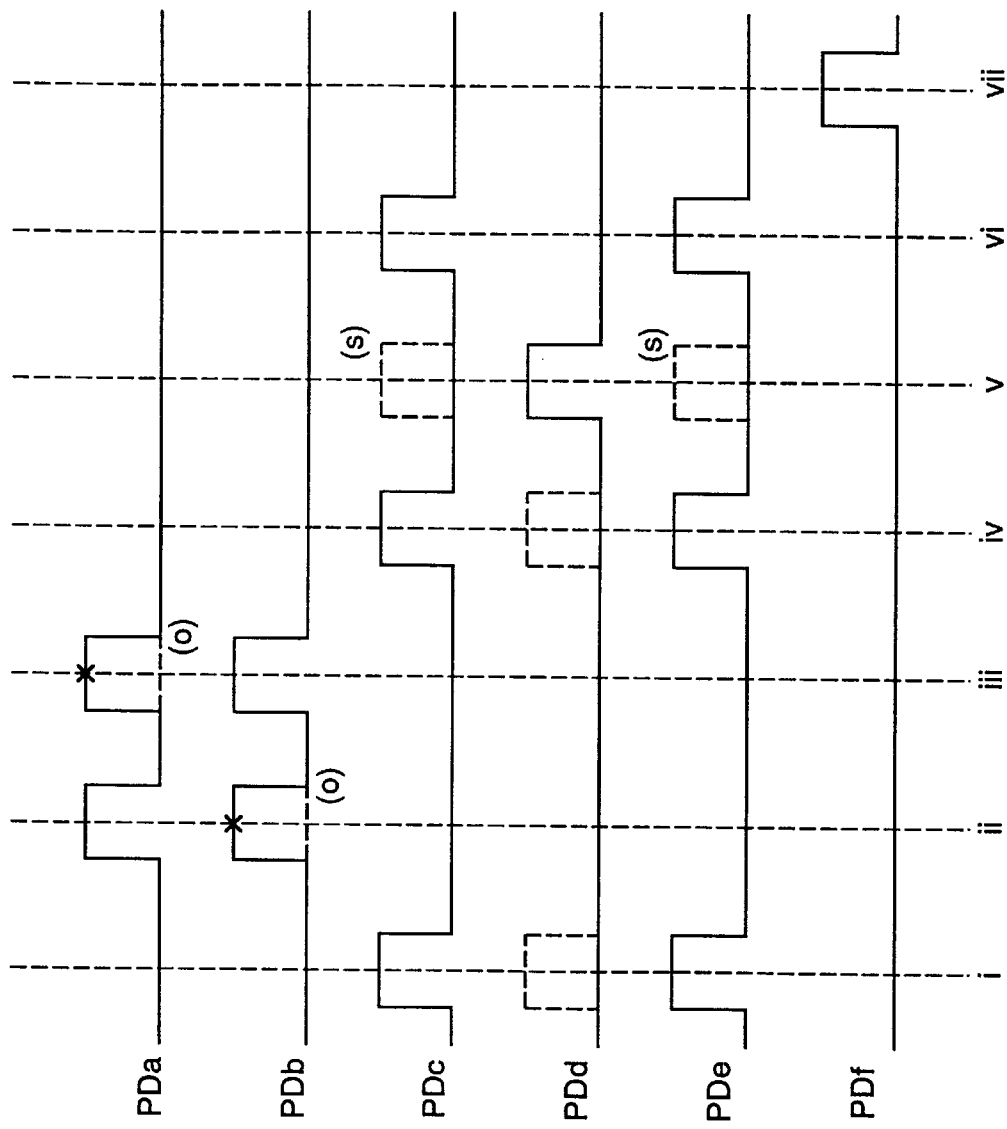
FIG. 9 is a timing chart showing the signals detected by the inspection apparatus of the first embodiment when the package in FIG. 8 is inspected.

Referring to FIG. 8, in the PGA package 100, in the package 100, the PPs 101 (ii to vii) are respectively connected to the BPs 102 (a to f) through lead wires 602, 604, 605, 606, 607, and 608. In addition, the lead wire 602 of the PP ii (and the PP iii) is short-circuited to the BP b (and the BP a) through a lead wire 603 within the ceramic portion. Furthermore, a lead wire from the PP i is short-circuited to the PPs iv and vi through lead wires 610 and 609 within the ceramic portion. This connection state is regarded as a normal state for the package 100 in FIG. 8.

Referring to FIG. 8, assume that the package 100 has the following faults. The lead wire 603 has a discontinuity, and the lead wire 601 is short-circuited to the lead wire 606 at a position 611.

The solid lines shown in the timing charts of FIG. 9 indicate changes in pin pad signals (to be referred to as PD signals hereinafter) on the PPs a to f at the respective times, with the abscissa indicating the time during which the probe unit 400 sequentially traces the seven BPs i to vii. More specifically, the solid lines indicate changes in a normal state of the package 100 in FIG. 8, and the broken lines indicate changes in a fault state. When the package 100 is in abnormal state, for example, high-level signals should be observed as PD signals detected at the PPs a and b at the times when the probe unit 400 traces the BPs ii and iii. However, since the lead wire 603 has a discontinuity, the signal b is at low level at time ii, and the signal a is at low level at time iii.

In addition, since a short is caused at the position 611 in the ceramic portion of the package 100, a signal d is detected as a high-level signal at times i and iv, and signals c and e are detected as high-level signals at time v.

As will be described later, since a reference signal $PD_M$ detected in a normal state is stored in the disk memory 520, faults such as discontinuities and shorts are detected as changes (differences) in the waveforms of measurement signals $PD_L$, which are actually detected from pin pads, with respect to the reference signal $PD_M$.

Figure 12:
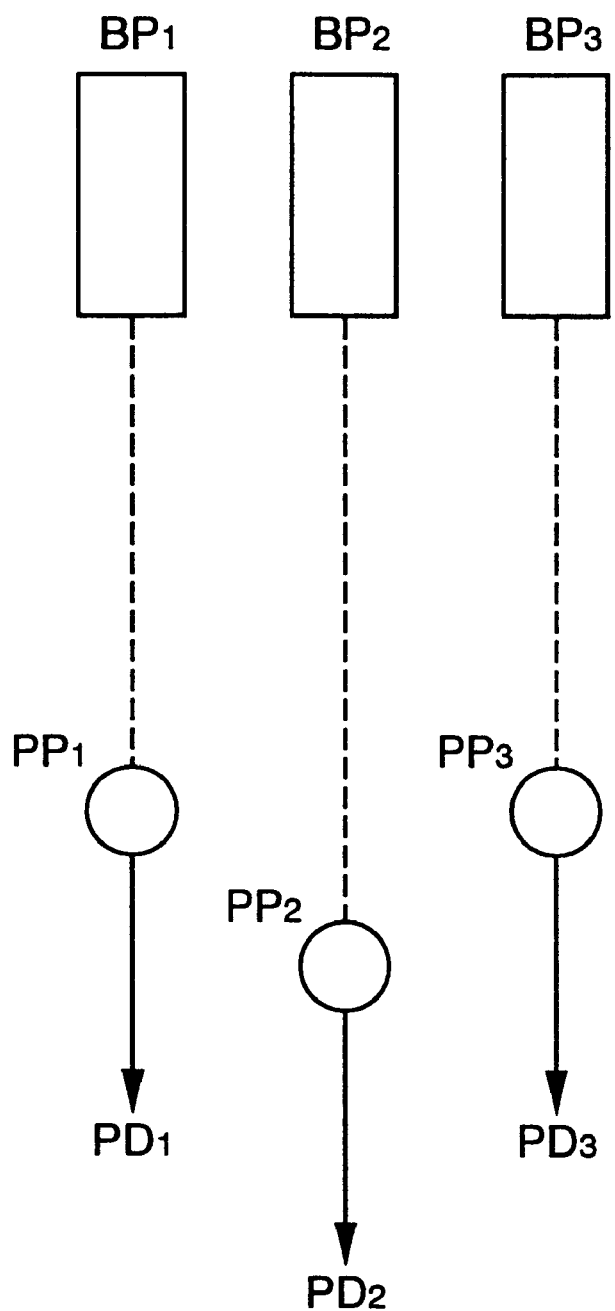
FIG. 12 is a view for explaining the principle of the signal detecting operation in the first embodiment.

A method of generating reference data will be described with reference to FIGS. 10 and 12.

FIG. 10 shows the storage format of reference data in the disk memory 520. The reference data is data obtained by performing a "wiping inspection" using a reference work (a package which has undergone checks on discontinuities and shorts and on which bonding pads and pin pads are mounted with a relatively high accuracy).

Referring to FIG. 10, time $t_1$, time $t_2$, time $t_3$, . . . are sampling times, and reference symbol $PD_n$ denotes a signal detected on the land of each pin pad. The waveform shaping unit 510 converts a signal detected at a PP into a signal of "0" or "1".

Figure 11:
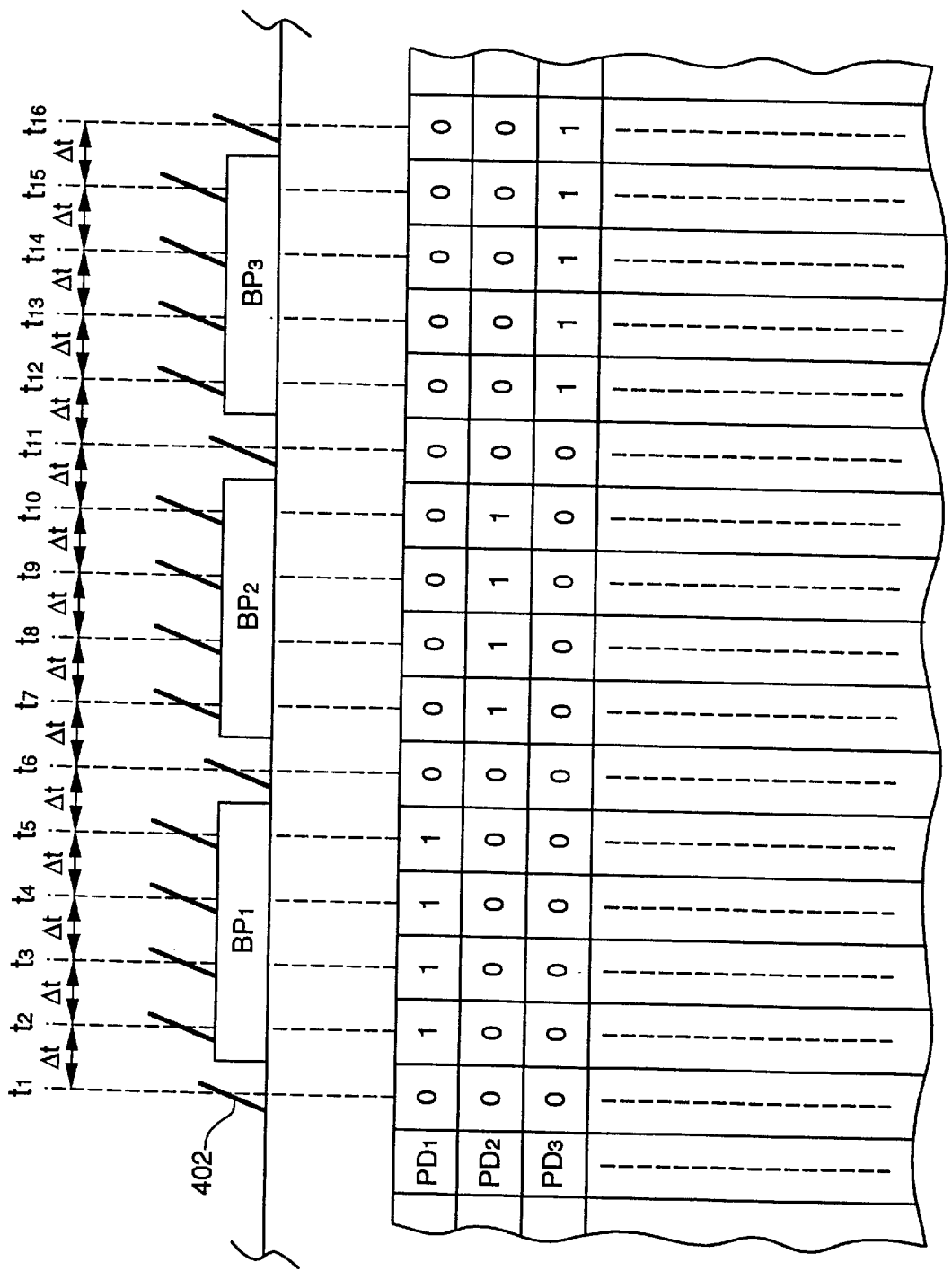
FIG. 11 is a view for explaining the principle of a signal detecting operation in the first embodiment.

FIG. 11 explains a method of generating the reference data $PD_M$. For the sake of a detailed description, FIG. 11 shows changes in signals $PD_M$ detected at pin pads $PP_1$, $PP_2$, and $PP_3$ when the pin 402 traces BPs 102 ($BP_1$, $BP_2$, and $BP_3$) by using a package (see FIG. 12), as the package 100, which has the pin pads $PP_1$, $PP_2$, and $PP_3$ respectively connected to lands $BP_1$, $BP_2$, and $BP_3$ of bonding pads. The disk memory 520 serves to store signal data obtained in this manner.

Signal data at the pin pads are sampled at predetermined time interval $\Delta t$, as shown in FIG. 11. The controller 500 controls the X-Y stage 250 to move the probe unit 400 (the pin 402 as well) at a constant velocity (velocity $v_c$). When the pin 402 of the probe unit 400 moves by $\Delta X$ in the X direction and $\Delta Y$ in the Y direction in the time interval $\Delta t$, the following equation is established:

$$\Delta X^2 + \Delta Y^2 = V_c \cdot \Delta t \tag{1}$$

All the PPs are sampled on the assumption that the probe unit 400 moves by a predetermined distance in the time interval $\Delta t$.

The moving velocity $V_c$ of the probe unit 400 is an average velocity. That is, the probe unit 400 should not be moved in the interval required to sample signals from all the PPs. If the probe unit 400 is moved in this interval, the timing at which the first or last PP of a PP group may coincide with the timing at which the pin 402 of the probe unit 400 slides a portion other than the BPs. For this reason, signal sampling at each PP is to be performed while the probe unit 400 is not moved. Therefore, when $\Delta t$ is the time required to move the probe unit 400 by a distance L, and $\Delta t_s$ is the time required to sample all the PPs without moving the probe unit 400, the moving velocity $V_c$ is given by $$L = V_c \cdot (\Delta t + \Delta t_s) \tag{2}$$

A control procedure for storing reference data will be described next with reference to the flow chart of FIG. 13. The control procedure in FIG. 13 is started when a user depresses a start switch (not shown) after a reference work package is mounted on the pin board 245, and the pin board 230 is lowered to fix the reference work.

Figure 13:
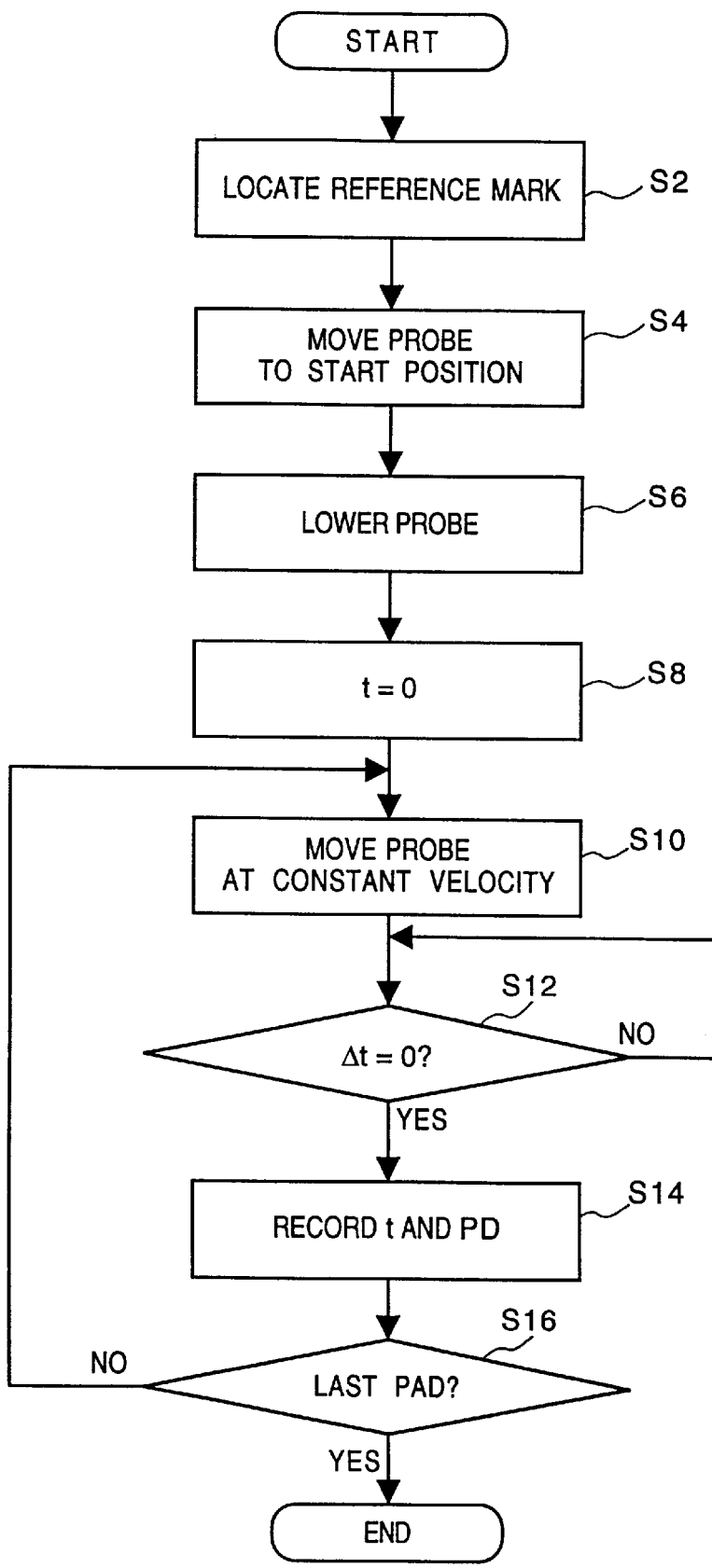
FIG. 13 is a flow chart showing a control procedure for acquiring reference signal data in the inspection apparatus of the first embodiment.

In step S2 in FIG. 13, the camera 300 is operated to sense an image of the BP 102, perform predetermined image processing, and locate or detect a reference mark (i.e., the position of the first BP). The reference mark has been described with reference to FIG. 4.

In step S4, the X- and Y-axis motors of the X-Y stage 250 are driven to move the probe unit 400 to the position of the detected mark. In step S6, the Z-axis motor is driven to lower the probe unit 400 so as to bring the pin 402 into contact with the first BP. In step S8, a timer t is initialized. In step S10, the X- and Y-axis motors are driven to start moving the probe unit 400 at the constant velocity $V_c$.

In step S14, an elapsed time t from step S8 to the current time and the value of each of the signals detected at all the PPs are stored in the disk memory 520 at the predetermined time intervals $\Delta t$.

The position of the last BP is detected in step S2. If it is determined in step S16 that the probe unit 400 has moved across the last BP, the operation is terminated.

With this operation, reference signal data like those shown in FIG. 10 are stored.

A method of detecting a fault state by performing a wiping operation with respect to an actual work and comparing the detected signals (measurement signals) $PD_L$ with the reference signals $PD_M$ stored in the disk memory 520 will be described in detail next.

Figure 14:
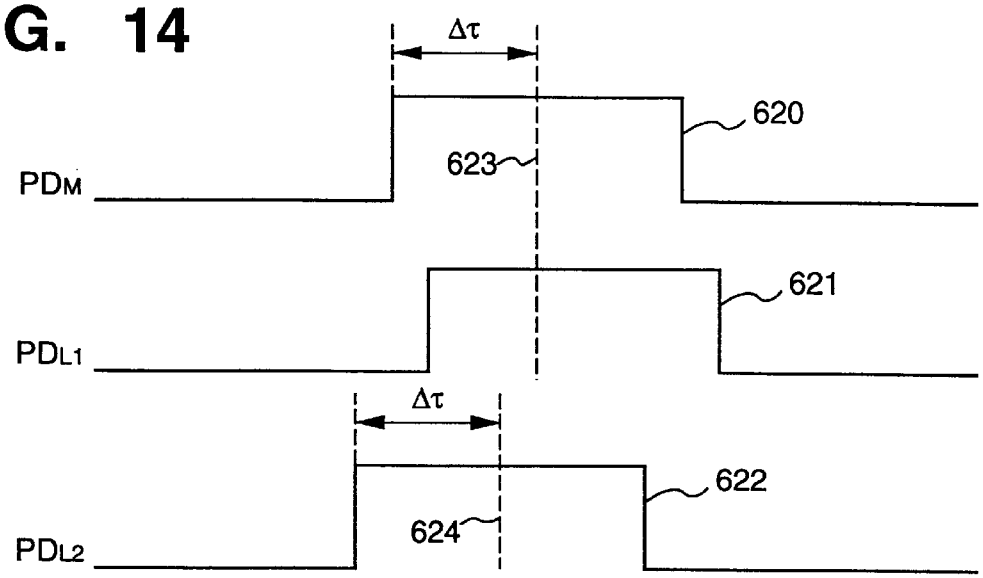
FIG. 14 is a timing chart for explaining the principle of defective portion detection in the inspection apparatus of the first embodiment.

Assume that a reference signal $PD_M$ 620 obtained by using a reference work is stored in the disk memory 520 in advance, and a slightly delayed signal $PD_L$ 621 and a slightly advanced signal $PD_L$ 622 relative to the reference signal $PD_M$ 620 are detected, as shown in FIG. 14.

In the first embodiment, in comparing two signals (reference and measurement signals), if the two signals have the same value at the time after the lapse of a time $\Delta\tau$ from the change point at which one of the signals whose "1" level is detected first changes from "0" level to "1" level, it is determined that the measurement signal is normal. Referring to FIG. 14, when the signal 621 (delayed with respect to the reference signal $PD_M$ 620) is detected, since both the measurement signal $PD_L$ and the reference signal $PD_M$ are at high level at time 623 after the lapse of the time $\Delta\tau$ from the change point at which the reference signal $PD_M$ changes from "0" level to "1" level, the measurement signal is normal (i.e., no discontinuity). Similarly, when the signal 622 (advanced with respect to the reference signal $PD_M$) is detected, since both the measurement signal $PD_L$ and the reference signal $PD_M$ are at high level at time 624 after the lapse of the time $\Delta\tau$ from the change point at which the measurement signal $PD_L$ changes from "0" level to "1" level, the measurement signal is normal (i.e., no discontinuity).

As described above, by comparing the values of two signals at the time after the lapse of the time $\Delta\tau$ from the change point at which one of the signals which appears first changes from "0" level to "1" level, a discontinuity/short can be determined while variations in the set position of a BP are compensated.

Figure 15A:
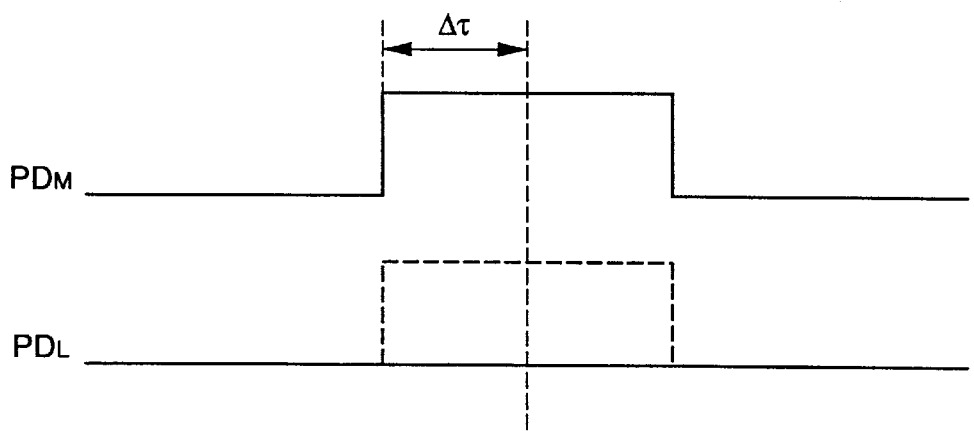
FIG. 15A is a timing chart for explaining the principle of defective portion detection in the inspection apparatus of the first embodiment.

FIG. 15A explains the principle of detection of a discontinuity in the first embodiment. If a discontinuity is caused, since the measurement signal $PD_L$ is not set at high level, a change from "0" level to "1" level is detected in the reference signal $PD_M$. In the case shown in FIG. 15A, since the measurement signal $PD_L$ is at "0" level at the time after the lapse of the time $\Delta\tau$ from the change point of the reference signal $PD_M$ (which is at "1" level at this time), the discontinuity can be reliably detected.

Figure 15B:
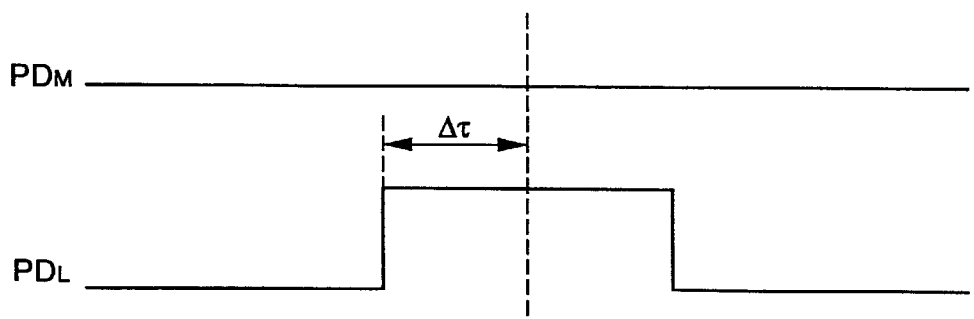
FIG. 15B is a timing chart for explaining the principle of defective portion detection in the inspection apparatus of the first embodiment.

If a short is caused, a change from "0" level to "1" level is detected in the measurement signal $PD_L$ while the reference signal $PD_M$ is at "0" level, as shown in FIG. 15B. Since the reference signal $PD_M$ 622 is at "0" level (at this time, the reference signal $PD_M$ is at "0" level) at the time after the lapse of the time $\Delta\tau$ from the change point of the measurement signal $PD_L$, the short can be reliably detected.

Figure 16:
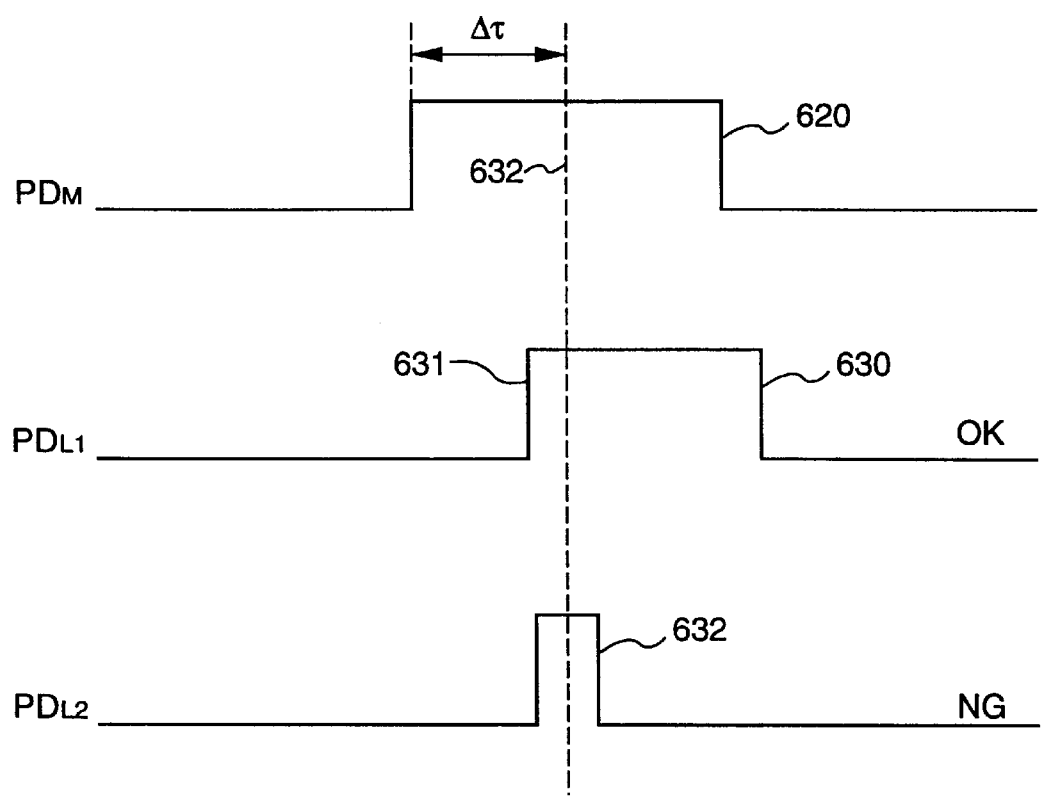
FIG. 16 is a timing chart for explaining the principle of defective portion detection in the inspection apparatus of the first embodiment.

The wiping method of the first embodiment allows determination of a discontinuity/short in even a defective BP which is narrow. Referring to FIG. 16, for example, a BP narrower than a reference work 620 generates a signal $PD_{L1}$ having a small width. In this case as well, since a leading edge 631 of a measurement signal $630_{L1}$ is advanced with respect to a position 632 corresponding to the lapse of the time $\Delta\tau$ from the leading edge of the reference signal $PD_M$ 620, it can be determined that this BP has no discontinuity or short.

An excessively narrow BP is not preferable because it may have a discontinuity in the future. In the first embodiment, since the wiping method is used, the width of each BP can be detected indirectly. The width of a BP can be detected by, for example, detecting the time width between the leading and trailing edges of the measurement signal $PD_L$. The time width of the signal $PD_L$ at "1" level, which is detected by this method, is compared with the time width of the reference signal $PD_M$. If, for example, the ratio of the former to the latter is 50% or less, it may be determined that the BP is defective. Referring to FIG. 16, for example, the measurement signal $PD_{L2}$ 632 indicates a normal BP in terms of a signal position but indicates a defective BP in terms of a signal width.

A procedure for determining a non-defective/defective state in a wiping inspection will be described in detail next.

Figure 17:
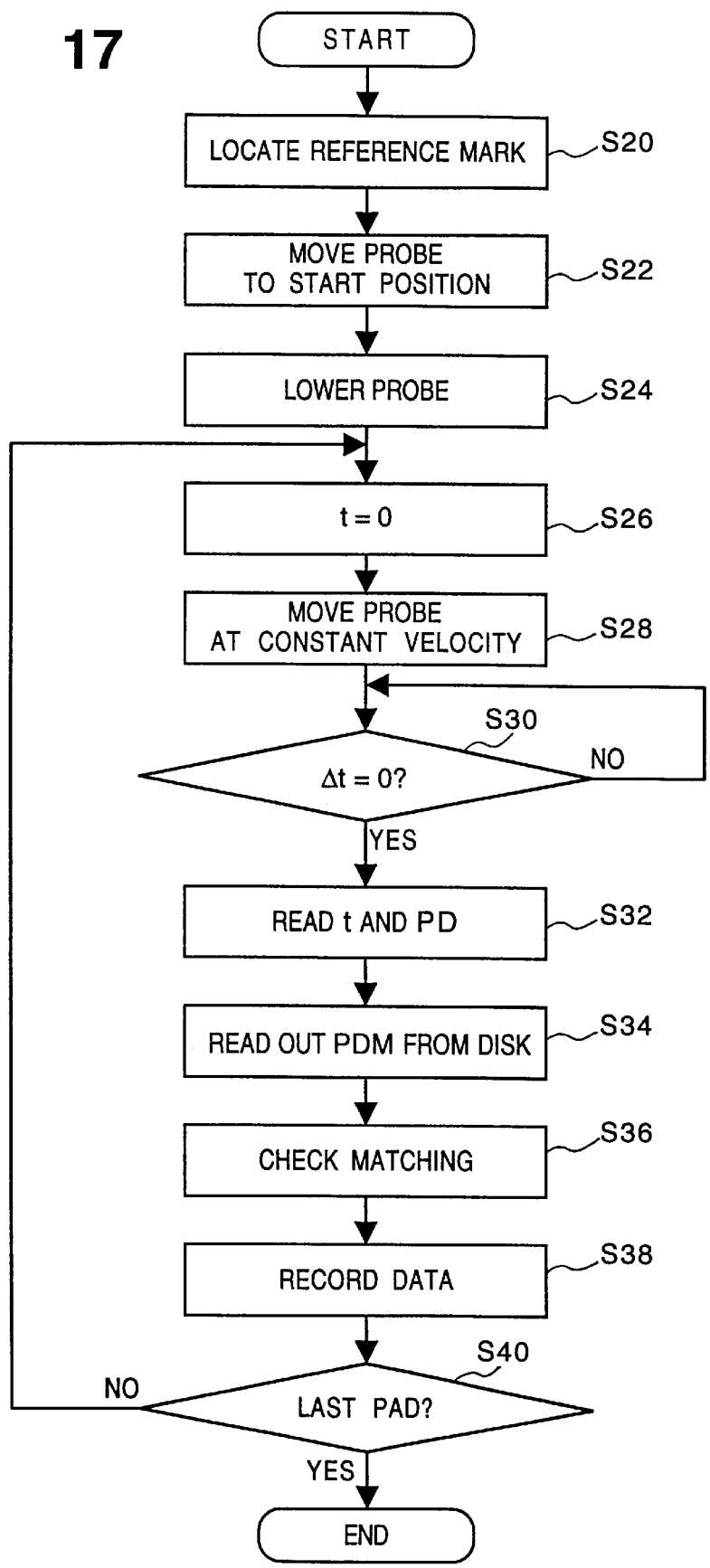
FIG. 17 is a flow chart showing a control procedure used by the inspection apparatus of the first embodiment to inspect a board as a work.

FIG. 17 shows a control procedure for detecting a short/discontinuity. Steps S20 to S28 in FIG. 17 are the same as steps S2 to S10 in the control procedure (FIG. 13) for recording reference signal data. That is, a wiping scan operation is started at a constant velocity from the first BP.

In step S30, the lapse of a sampling time $\Delta t$ is monitored. When the time $\Delta t$ has elapsed, an elapsed time $t_x$ from step S20 and all the measurement signals $PD_L$ detected at all the PPs at the time $t_x$ are read. The time $t_x$ and the measurement signals $PD_L$ are temporarily stored in the disk memory 520 or the memory 540. In step S34, the reference signals $PD_M$ corresponding to the elapsed time $t_x$ within the range of a time width $-\Delta\tau$ to a time width $+\Delta\tau$ are read out from the disk memory 520. More specifically, of the reference signals $PD_M$ stored in the disk memory 520, signals in the range of $t_x-\Delta\tau$ to $t_x+\Delta\tau$ are read out. In step S34, of the measurement signals $PD_L$ temporarily stored in the disk memory 520 or the memory 540, signals in the range of $t_x-\Delta\tau$ to $t_x$ are read out, as needed. In step S36, a matching test is performed by the method described with reference to FIGS. 14 to 16. The check result is stored in the disk memory 520.

After the inspection, the check results stored in the disk memory 520 are displayed or printed, the user sees them to determine whether the package having undergone the above test is non-defective/defective.

Modification of First Embodiment

Figure 18:
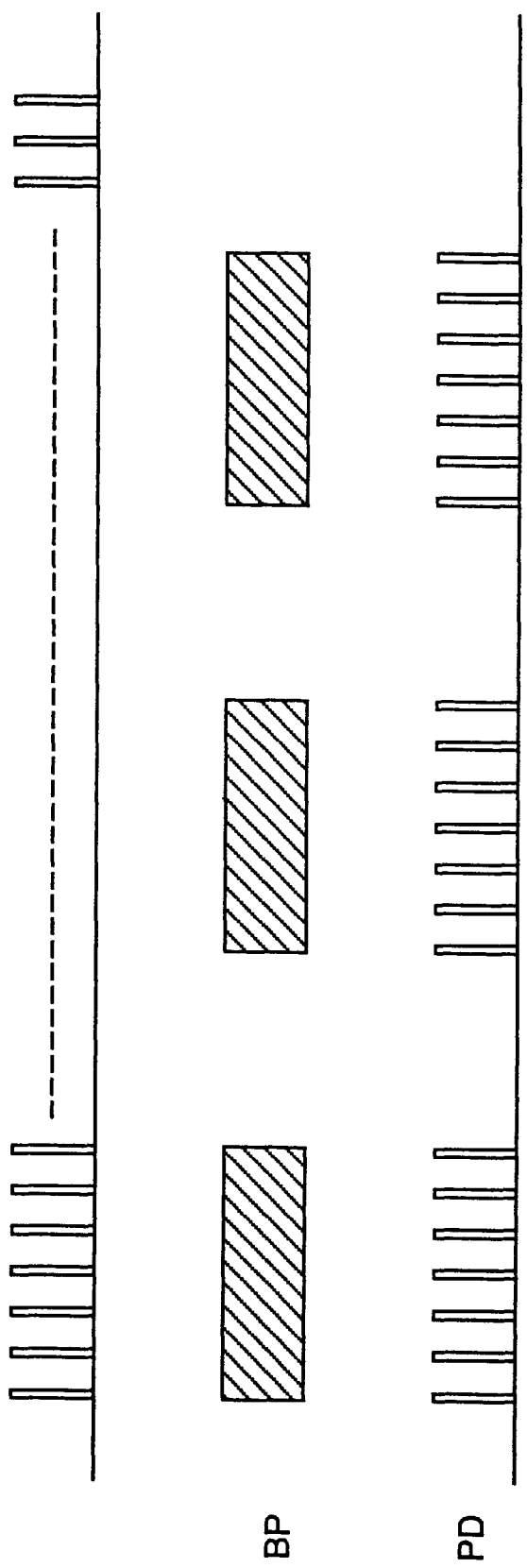
FIG. 18 is a timing chart showing another electrical signal used in the inspection apparatuses of the first to third embodiments.

①: In the first embodiment, a DC signal is supplied to the land of each BP. For this reason, every time the pin 402 of the probe unit 400 comes in contact with a BP, a DC high-/low-level signal is detected on the BP. The signal supplied to the BP may be a pulse signal. In this case, a pin pad signal PD as shown in FIG. 18 is detected.

②: In the first embodiment, the movement of the probe unit 400 is stopped in the interval in which all pin pad signals are sampled. The present invention is not limited to this. In some case, the probe unit 400 can be moved even in a PP sampling interval. Assume that each BP is relatively wide, the moving velocity is relatively low, or the speed of sampling all the PPs is very low. In such a case, even if the probe unit 400 is moved in a PP sampling interval, the ratio of a sampling interval $\Delta_P$ to a time width $\Delta t$ during which the probe pin 402 is on a BP is relatively large. This decreases the probability of sampling an end PP to fall outside a time zone in which the pin 402 is in contact with a specific BP.

③: The data stored in the disk memory 520 include "1"-level data (based on the width of each BP), each having a predetermined length, and "0"-level data (based on the length of each BP group), each having a predetermined length, in large quantities. For this reason, the data can be efficiently compressed by encoding the data using the run-length encoding method by which these runs can be encoded into codes most efficiently.

④: In the above embodiment, reference data is generated by using a reference work. If, however, the positions of BPs and PPs on a work to be inspected are known, reference data need not always be generated by using a reference work. If the moving velocity of the probe is known as well as the positions of BPs and PPs, a signal generation pattern can be predicted. An inspection can therefore be performed.

⑤: In the first embodiment, when a change from "0" level to "1" level is detected in the signal PD, it is regarded that contact of the probe unit 400 with a BP is detected. The present invention is not limited to this. The first embodiment is based on the premise that reference data is generated in advance from a reference work by using the probe unit 400 which is moved at a constant velocity. In other words, an elapsed time in reference data is inseparable from the position of each BP. That is, the time at which a signal PD is sampled can be determined in advance for each BP. As a modification, a method of generating sampling times for signals PD at the respective BPs as a file in advance, instead of detecting a change from "0" level to "1" level in FIG. 14, is proposed.

Second Embodiment

The inspection apparatus of the first embodiment requires the condition that the moving velocity of the probe unit 400 in tracing a reference work must not greatly differ from the moving velocity in tracing an actual work, or is based on the premise that the positions of BPs and PPs and the moving velocity of the probe unit 400 are known. In the first embodiment, it is only after signals are detected at the respective PPs that the corresponding BPs and conducting routes are specified. That is, the positions of the BPs to be inspected are estimated by the above probe operation. For this reason, if there is a possibility of a circuit open state, a specific position at which a signal is currently supplied must be detected.

According to the second embodiment, there is provided an inspection apparatus which allows easy detection of a specific BP to which a signal is currently supplied.

Figure 19:
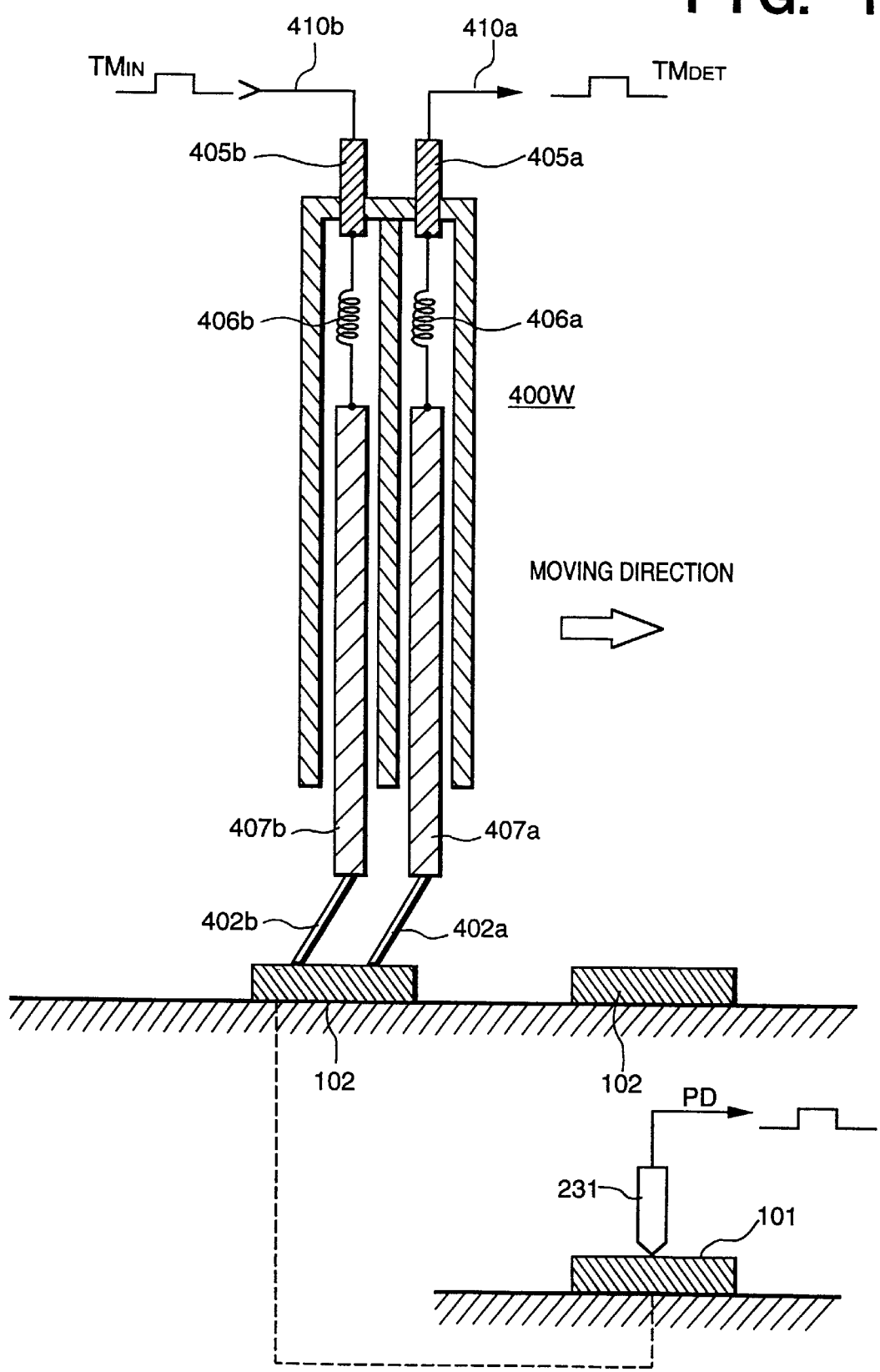
FIG. 19 is a sectional view showing the structure of an inspection probe used in the inspection apparatus of the second embodiment.

FIG. 19 shows the arrangement of a probe unit 400W used in the inspection apparatus of the second embodiment. This probe 400W has two probes, each identical to the probe unit 400 in the first embodiment, which are arranged side by side. The probe 400W has tungsten coils 406a and 406b, pistons 407a and 407b respectively supported by the coils 406a and 406b, and probe pins 402a and 402b respectively attached to the lower portions of the pistons 407a and 407b.

A signal $TM_{IN}$ is input to the pin 402b through a wire 410b, a terminal 405b, the coil 406b, and the piston 407b. When the pin 402b comes in contact with a BP 102, a signal $TM_{DET}$ detected at the pin 402a is output through the piston 407a, the coil 406a, a terminal 405a, and a wire 410a.

Both the wires 410a and 410b are connected to a controller in the second embodiment. When the controller in the second embodiment sends the signal $TM_{IN}$ to the wire 410b while the pins 402a and 402b are on the BP 102, the signal is detected as the signal $TM_{DET}$ at the wire 410a. For this reason, the distance between the pins 402a and 402b must not be larger than the width of the BP 102.

Figure 20:
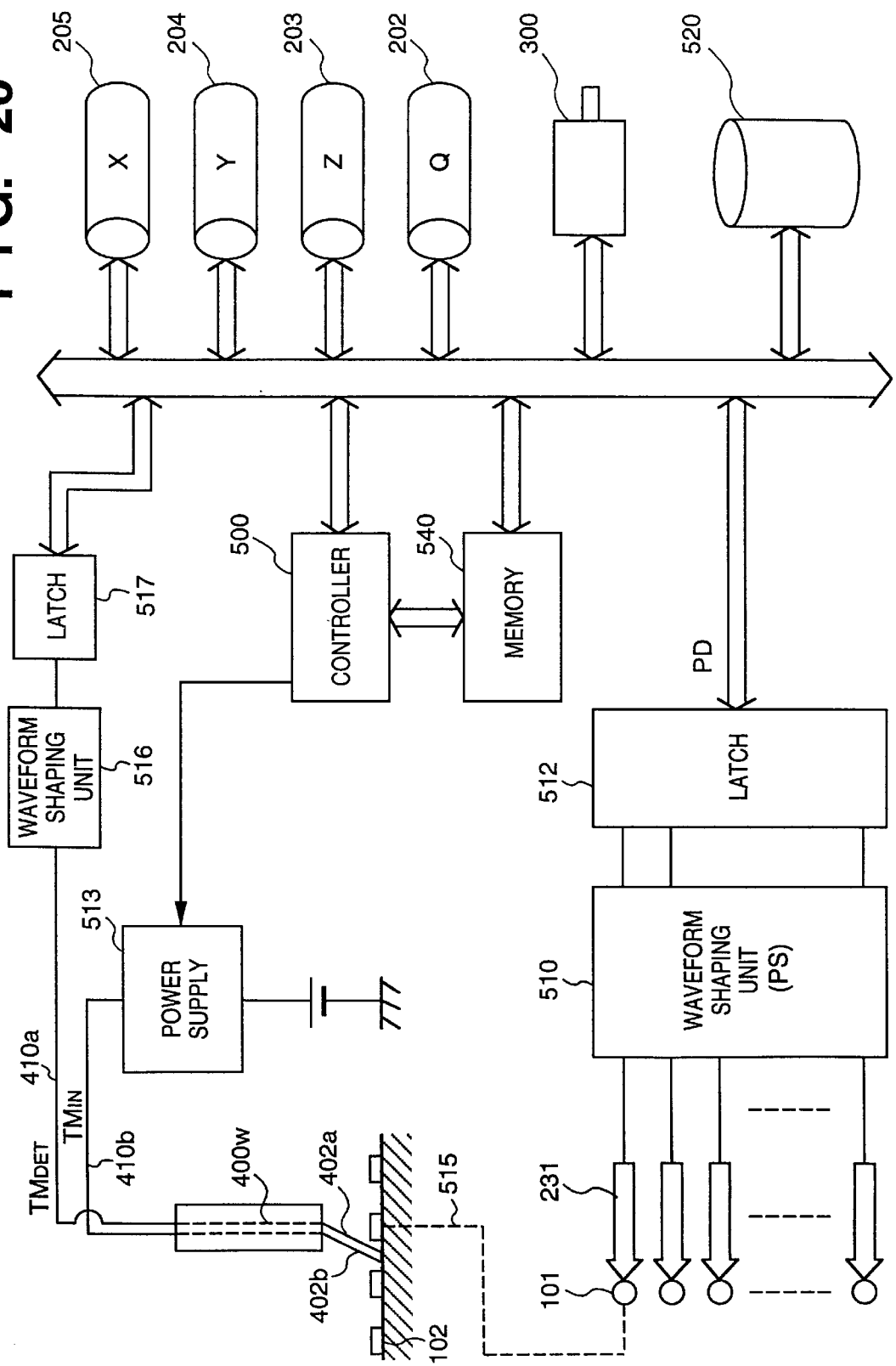
FIG. 20 is a block diagram showing the system arrangement of a control system in the inspection apparatus of the second embodiment.

FIG. 20 shows the arrangement of the inspection system of the second embodiment. The same reference numerals in FIG. 20 denote the same constituent elements as those of the system in FIG. 7. As compared with the system in FIG. 7, in this system, the probe is modified, and a waveform shaping unit 516 and a latch 517 are newly added.

Figure 21:
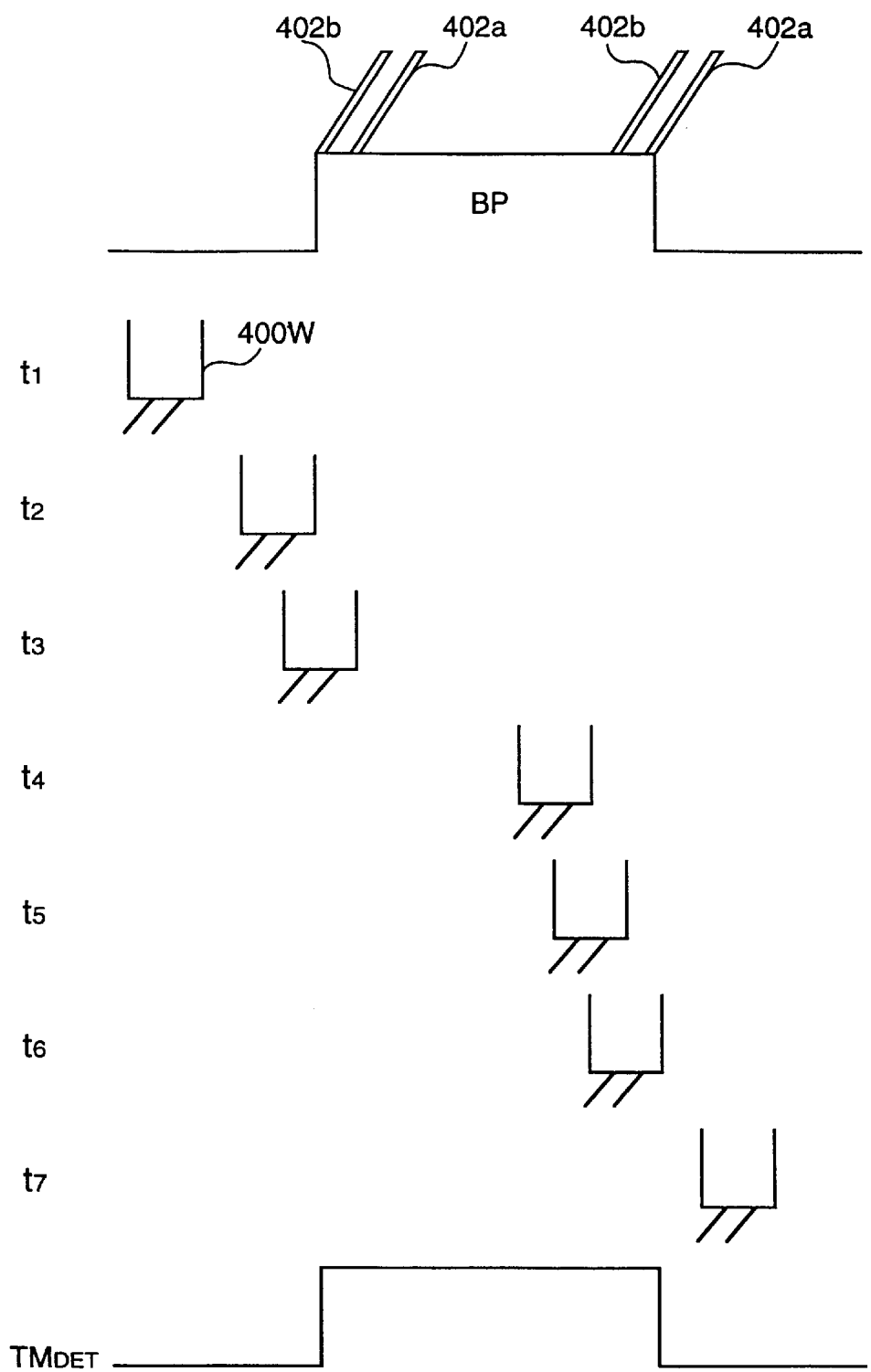
FIG. 21 is a timing chart showing the operation of the inspection probe in the second embodiment.
Figure 22:
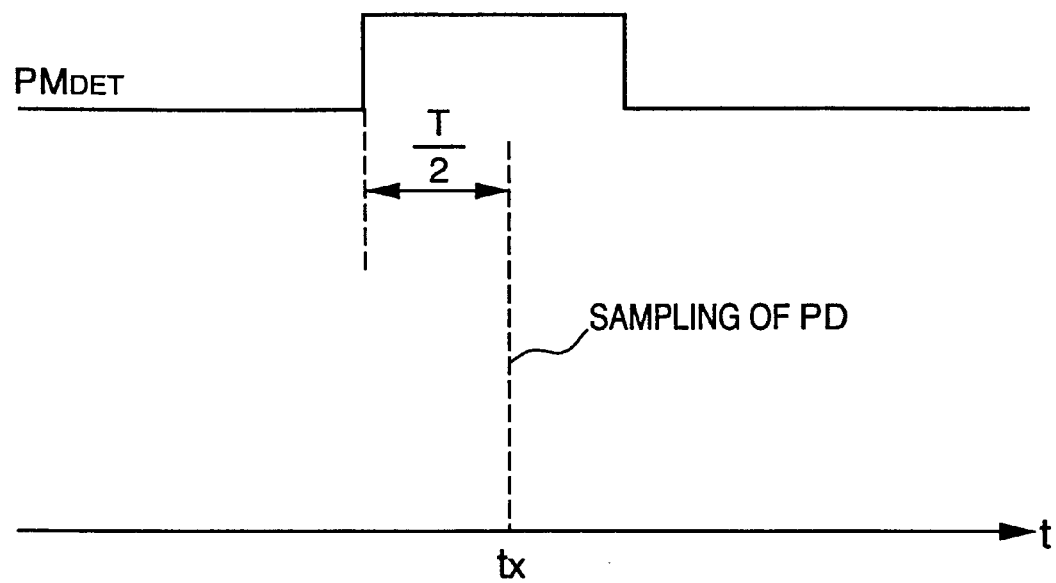
FIG. 22 is a timing chart showing the operation of the inspection probe in the second embodiment.

FIGS. 21 and 22 explain the principle of inspection in the second embodiment.

FIG. 21 illustrates the process in which the probe 400W approaches a given BP 102, traces the BP 102, and separates therefrom, with the abscissa indicating the moving distance from a reference mark. At time $t_1$, since the probe 400W is not in contact with the BP, the signal $TM_{DET}$ is not detected. At time $t_2$, since the pin 402b of the probe 400W is not in contact with the BP although the pin 402a is in contact with the BP, the signal $TM_{DET}$ is not detected. In the interval between time $t_3$ and time $t_4$, since the two pins 402a and 402b of the probe 400W are in contact with the BP, the signal $TM_{DET}$ is detected. In the interval between time $t_5$ and time $t_7$, since both or either of the pins 402a and 402b of the probe 400W is not in contact with the BP, the signal $TM_{DET}$ is not detected.

In the second embodiment, detection of the signal $TM_{DET}$ indicates that the two pins 402a and 402b of the probe 400W are always in contact with the BP. This is because no interconnection which may have a discontinuity is present between the two pins 402a and 402b. Therefore, the signal $TM_{DET}$ in FIG. 21 is obtained upon movement of the probe 400W, and the position of "1" level of the signal $TM_{DET}$ corresponds to the position of each BP.

FIG. 22 explains the same signal $TM_{DET}$ as that described above, with the abscissa indicating the time axis. In the second embodiment, signals PD are to be sampled at all PPs a time T/2 after a change from "0" level to "1" level is detected in the signal $TM_{DET}$. Letting T be the time required to trace one BP having a typical width W, and $V_c$ be the moving velocity of the probe 400W, $$W = V_c \cdot T$$

Therefore, both the pins 402a and 402b of the probe 400W are located near the center of the BP about the time T/2 after the signal $TM_{DET}$ is detected. By setting a sampling time in this manner, the timing at which the probe 400 is located on a BP can be accurately detected without detecting the accurate position of the BP formed on a work board.

Figure 23:
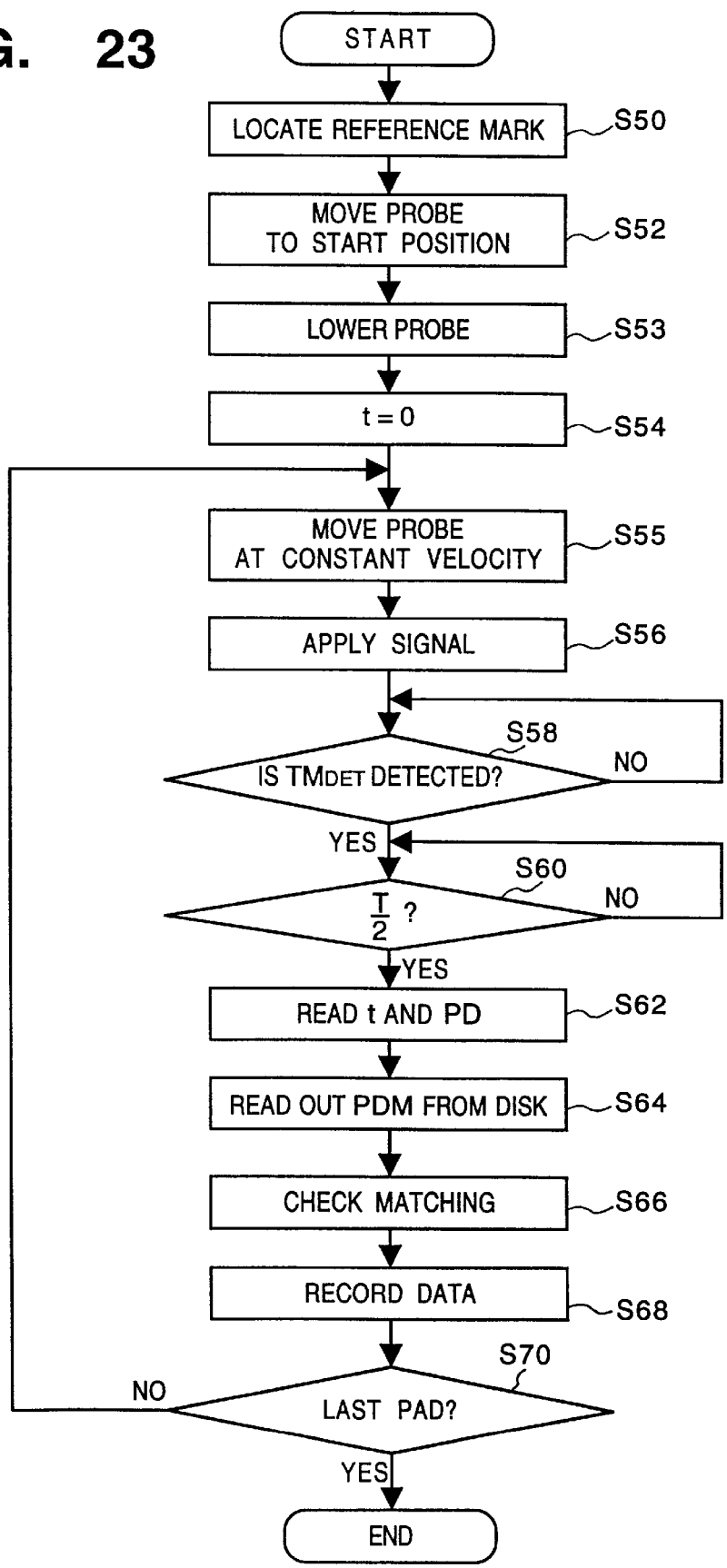
FIG. 23 is a flow chart showing a control procedure in the second embodiment.

FIG. 23 shows a control procedure for a controller 500 in the second embodiment.

Steps S50 to S55 in FIG. 23 are the same as steps S20 to S28 in the first embodiment.

In step S56, a signal $TM_{IN}$ is applied to the pin 402b through a power supply 513. This signal may be a DC signal or a pulse-like signal like the one shown in FIG. 18.

In step S58, the flow waits for detection of the signal $TM_{DET}$. When the signal $TM_{DET}$ is detected, the flow waits for the lapse of the time T/2 in step S60. In step S62, the signal PD and an elapsed time t are read. In step S64, reference data $PD_M$ at a time near the elapsed time t from step S54 is read. Mismatching is detected by comparing the signal PD read in step S66 with the reference data $PD_M$.

As described above, according to the inspection apparatus of the second embodiment, since the time during which the probe is actually in contact with a BP can be accurately detected, a short or discontinuity in an interconnection can be inspected without detecting the accurate position of the BP.

In the inspection apparatus of the second embodiment as well, when a different BP is to be inspected, the probe 400 is rotated.

Modification of Second Embodiment

The second embodiment uses the reference data $PD_M$ to inspect a short. In the second embodiment, however, since the probe 400W has the two pins 402a and 402b, the time during which the probe is actually in contact with a BP can be accurately detected. For this reason, if the method of the second embodiment is applied to an inspection apparatus which need not inspect any short but is designed to inspect only discontinuities, generation and storage of reference data and collation (step S66) with the reference data need not be performed.

Third Embodiment

The inspection apparatuses of the first and second embodiments are suitably used to inspect solid shorts and discontinuities between interconnections. Solid shorts and discontinuities remain as they are unless they are repaired. In each of the first and second embodiments, 5 V is sufficient for the voltage level of a signal supplied from the power supply to a BP through the probe unit 400 to inspect a solid short or discontinuity. In practice, however, as compared with solid shorts and discontinuities, a semi-short/semi-discontinuity state (to be referred to as a semi-short state hereinafter) relatively frequently occurs between interconnections within the range of $10\Omega$ to $100 M\Omega$. If such a state is overlooked, the electronic circuit intermittently fails. In the third embodiment, such a semi-short state is inspected at the same time when a solid short or discontinuity is inspected in accordance with the method of the first or second embodiment.

Figure 24A:
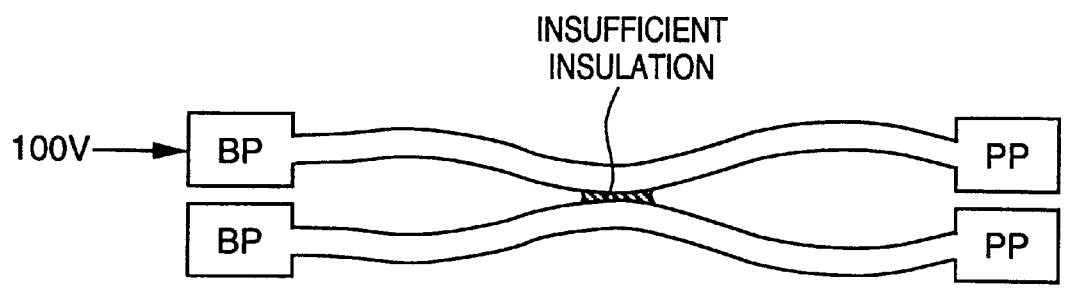
FIG. 24A is a view for explaining a fault to be inspected by the inspection apparatus of the third embodiment.
Figure 24B:
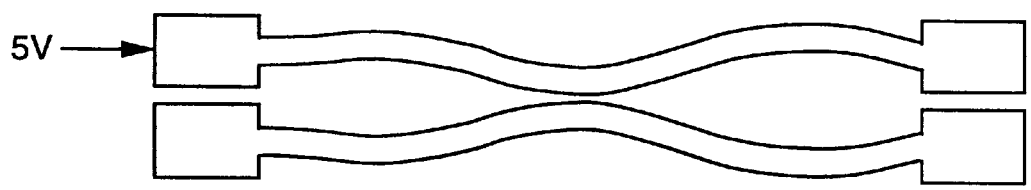
FIG. 24B is a view for explaining a fault to be inspected by the inspection apparatus of the third embodiment.

FIG. 24A shows two lead wires in a semi-short state. It is known that when a large current is supplied to a lead wire in a semi-short state, the corresponding portion is generally changed into a high-resistance portion to become "non-defective". Conventionally, in the insulation inspection step shown in FIG. 24A, a voltage of about 100 V is applied to a BP or PP. After a work is made non-defective by applying 100 V to a BP or PP, a signal of 5 V is applied to the BP or PP in a stage different from the insulation inspection stage in FIG. 24A, as shown in FIG. 24B, thereby inspecting a solid short or discontinuity in the interconnection or between the interconnections. The reason why the insulation inspection and the inspection of a solid discontinuity are performed in the different stages is that the signals applied for the respective inspections have different voltage values.

In the third embodiment, inspection of a "semi-short state" (insufficient insulation) and inspection of a solid short/discontinuity are performed in one stage.

The arrangement of the inspection apparatus of the third embodiment is basically the same as that of each of the inspection apparatuses of the first and second embodiments. Therefore, the system arrangement in FIG. 7 can be used when the probe 400 having one pin is to be used, and the system arrangement in FIG. 20 can be used when the probe 400W having two pins is to be used.

Figure 25:
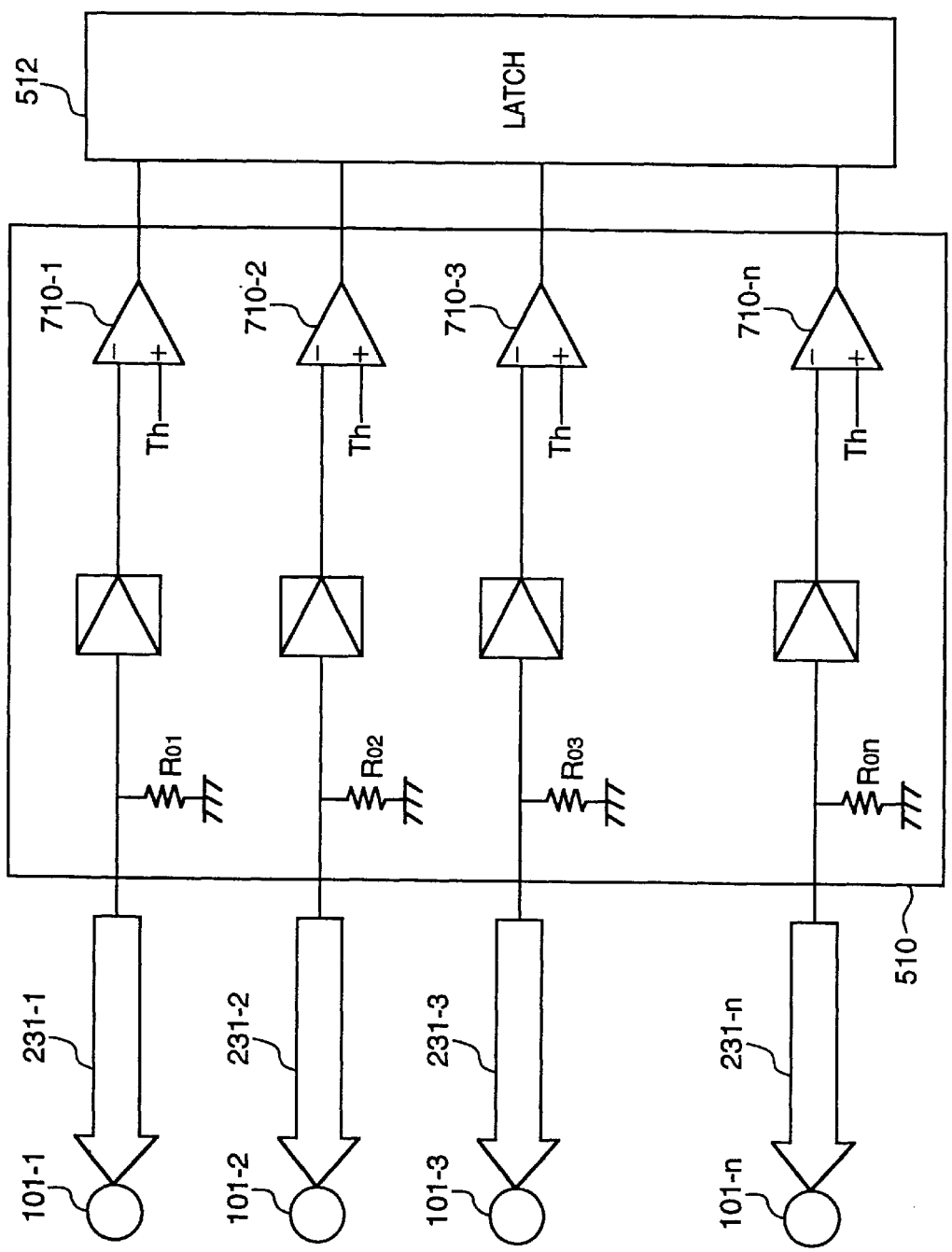
FIG. 25 is a block diagram showing a modified portion of the inspection apparatus of the third embodiment with respect to the apparatus of the first embodiment.

FIG. 25 shows the arrangement of a waveform shaping unit to be used in place of the waveform shaping unit 510 in FIG. 7 or 20 when the inspection apparatus of the third embodiment is to be applied to the system in FIG. 7 or 20. Referring to FIG. 25, reference numerals 700-1 to 700-n denote n amplifiers, each connected to a corresponding press pin 231. That is, a signal at each PP which is detected by the press pin 231 is amplified by each amplifier 700. Load resistors $R_{O1}$ to $R_{On}$ are respectively connected to the amplifiers 700-1 to 700-n. The output of each of the amplifiers 700-1 to 700-n is connected to one terminal of a corresponding one of comparators 710-1 to 710-n. A predetermined threshold voltage $V_{TH}$ is applied to the other terminal of each comparator. If, therefore, the gain of the signal detected at the PP is higher than a threshold $V_{TH}$, "1" is stored in a latch 512.

In the third embodiment, the peak value of a signal applied to a BP through the probe unit 400 is set to be 100 V for a reason to be described later.

Figure 26:
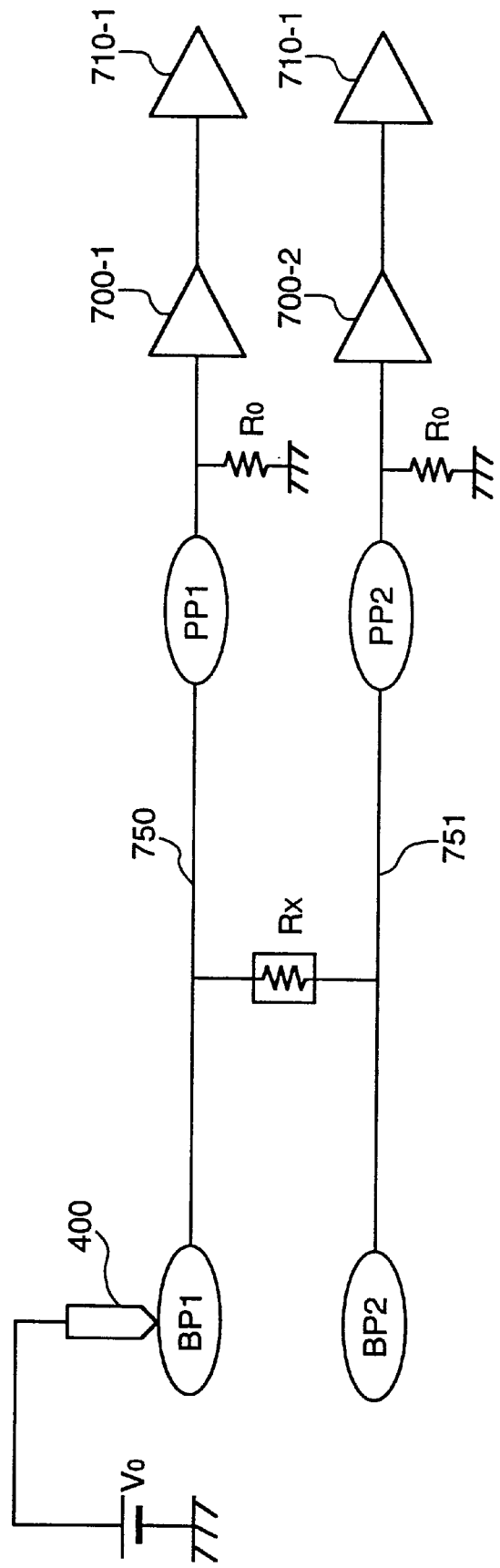
FIG. 26 is a circuit diagram for explaining the principle of the third embodiment.

For the sake of descriptive convenience, FIG. 26 shows the principle on which the inspection apparatus of the third embodiment inspects a work to which two pairs of BPs and PPs are connected. In this work, a bonding pad BP1 and a pin pad PP1, and a bonding pad BP2 and a pin pad PP2 are respectively connected in a ceramic package through interconnections 750 and 751. The interconnections 750 and 751 must be insulated from each other with a resistance of $100 M\Omega$ or more.

Assume that the probe 400 (or 400W) based on the wiping method of the first or second embodiment is applied to the inspection apparatus of the third embodiment. In this case, when, for example, the probe unit 400 is on the bonding pad BP1 as shown in FIG. 26, a voltage value $V_{X2}$ of a signal output to the output terminal of the amplifier 700-2 connected to the pin pad PP2 is given by $$V_{X2} = G \cdot \frac{V_0}{\frac{R_X}{R_{02}} + 1} \quad (3)$$

where G is the amplification factor of the amplifier 700, $R_X$ is the insulating resistance value between the interconnections 750 and 751, and $R_{02}$ is the load resistance (terminating resistance) of the pin pad PP2. If the insulation is insufficient, $R_X >> R_{02}$. Equation (3) is therefore rewritten into $$V_{X2} = G \cdot \frac{V_{0\_}R_{02}}{R_X} \quad (4)$$

Assume that in this embodiment, if the resistance value $R_X$ is $100 M\Omega$ or more, the insulation between the interconnections is sufficient. Therefore, $R_X=100 M\Omega$. As described above, since a current of 1 mA needs to be supplied to a portion in a semi-short state (e.g., a resistance value of $100 k\Omega$) to make it non-defective, the voltage $V_0$ needs to be set to about 100 V ($=10^{-3} \times 100 \times 10^3$). The noise level of a PGA work to which this embodiment is applied reaches several tens mV. In order to obtain a sufficient S/N ratio with respect to such noise, the voltage value $V_{X2}$ is preferably set to about 1 V. In this case, the proper terminating resistance $R_{02}$ is $10 k\Omega$ ($=100 \times 10^6 \div 100 \div 100$).

Assume that in the third embodiment, the nominal value of the insulating resistance of the work to which this embodiment is applied is $100 M\Omega$. In this case, if the resistance value between interconnections decreases below $100 M\Omega$, the voltage value $V_{X2}$ changes to less than 1 V. In contrast to this, if the resistance value between interconnections increases beyond $100 M\Omega$, the voltage value $V_{X2}$ changes to 1 V or more. Therefore, the proper threshold $V_{TH}$ input to the comparator 710 is about 1 V under the condition of G=100, $R_X=100 M\Omega$, and $R_0=10 k\Omega$.

The principle of a method of detecting discontinuities and semi-shorts in interconnections according to the third embodiment will be described with reference to FIG. 26. Assume that $V_{TH}=1$ V, G=100, and $R_0=10 k\Omega$ are set in the inspection system in FIG. 25. Also, assume that the input dynamic range of the amplifier 700 falls within the range of 0 V to 100 V.

A case wherein there is neither discontinuity between the bonding bad BP1 and the pin pad PP1 nor semi-short (short) between the interconnections 750 and 751 will be described first with reference to FIG. 26.

In this case, when the probe unit 400 is on the bonding bad BP1, a signal of about 100 V is input to the amplifier 700-1 corresponding to the bonding bad BP1. As a result, $V_{X1} > 1$ V, and hence the output from the comparator 700-1 is set at high level. That is, the signal PD1 is detected as a high-level signal, and it is determined that there is no discontinuity between the bonding bad BP1 and the pin pad PP1. In addition, since no signal is applied from the probe unit 400 to the bonding bad BP2, $V_{X2} < 1$ V is detected, and the output from the comparator 710-2 is set at low level unless a semi-short (or short) is caused between the interconnections 750 and 751. That is, it is determined that there is no semi-short between the interconnections 750 and 751.

Assume that there is no discontinuity between the bonding bad BP1 and the pin pad PP1, but there is a semi-short between the interconnections 750 and 751. In this case, although the output from the comparator 710-1 is at high level, leakage from a signal of 100 V from the probe unit 400 occurs, and $V_{X2} > 1$ V. As a result, the output from the comparator 710-2 is set at high level. With this operation, it is detected that there is a semi-short between the interconnections 750 and 751.

①: When the presence/absence of a discontinuity between one BP and one or a plurality of PPs connected to each other through an interconnection is to be checked, a signal is applied to the BP to be inspected, and the signal PD is detected at the corresponding PP or PPs. If this signal PD is at high level, it is determined that there is no discontinuity. If the signal PD is at low level, it is determined that there is a discontinuity.

②: When the presence/absence of a short between two interconnections is to be checked, a signal is applied from the probe unit 400 to a BP connected to one interconnection, and the signal PD is detected at a PP connected to the other interconnection. If this signal is at low level, it is determined that there is no short between the two interconnections. If the signal is at high level, it is determined that there is a short (semi-short) between the two interconnections.

Figures 27, 28:
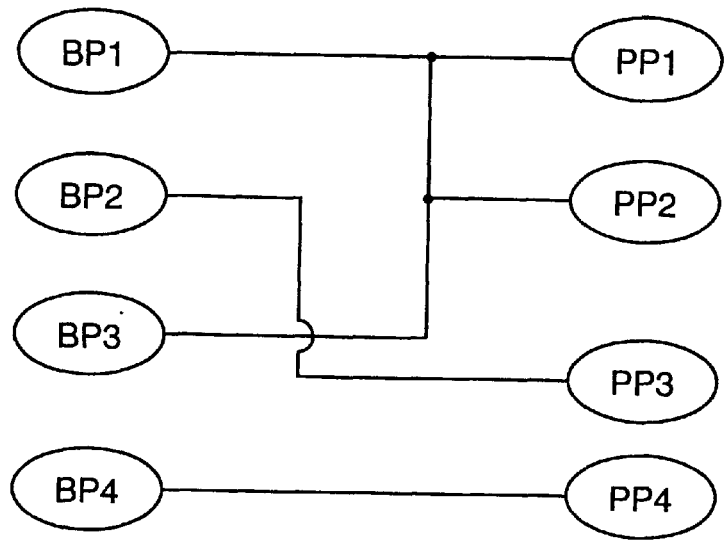
FIG. 27 is a circuit diagram for explaining the interconnections of a PGA package to be inspected in the third embodiment.
FIG. 28 is a view showing one form of storing data indicating the wiring relationship of a package which is used in the third embodiment.

In the third embodiment, the wiring information of the interconnections on a work to be inspected is required. This file is called wiring information. Consider, for example, a work having interconnections like those shown in FIG. 27. In this case, the wiring information file has an arrangement like the one shown in FIG. 28. That is, the wiring information file has one record per BP. Each record for each BP has a field 800 for specifying PPs to be sampled to check shorts (semi-shorts) between interconnections, and a field 801 for specifying PPs to check discontinuities in interconnections. For example, in the case shown in FIG. 27, since a bonding pad BP1 is connected to only pin pads PP1 and PP2, the field 800 for the bonding pad BP1 includes data "PP3, PP4" as PPs for which a check on a short is to be performed, and the field 801 includes data "PP1, PP2" as PPs for which a check on discontinuities is to be performed. That is, when a short is to be checked for the bonding pad BP1, signals PD3 and PD4 are sampled at pads PP3 and PP4. If one or both of the signals PD3 and PD4 are detected as a high-level signal or high-level signals, it is determined that there is a short between the bonding pad BP1 and one or both of the pads PP3 and PP4. When discontinuities are to be checked for the bonding pad BP1, signals PD1 and PD2 are sampled at the pads PP1 and PP2. If one or both of the signals PD1 and PD2 are detected as a low-level signal or low-level signals, it is determined that there is a discontinuity between the bonding pad BP1 and one or both of the pads PP1 and PP2.

Figure 29:
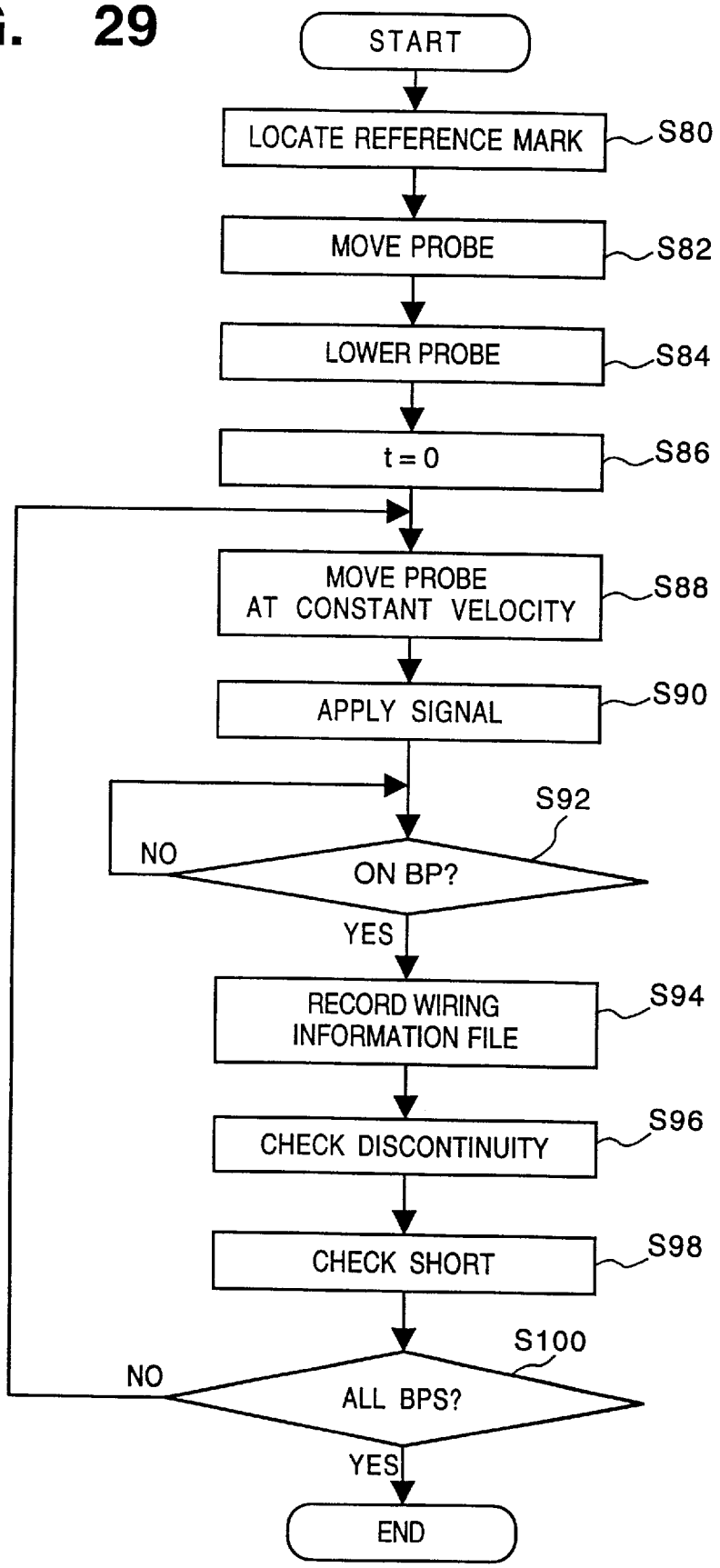
FIG. 29 is a flow chart showing a control procedure in the third embodiment.

FIG. 29 is a flow chart showing a control procedure in the third embodiment.

In step S80, a reference mark indicating a pad from which an inspection is to be started is located or detected by an image processing technique. In step S82, the probe unit 400 (the probe in the third embodiment includes the probe 400 in the first embodiment and the probe 400W in the second embodiment) is moved to the position of the start pad having the reference mark. In step S84, the probe unit 400 is lowered on the start pad. In step S86, an elapsed time register t is cleared. In step S88, the probe unit 400 is moved at a constant velocity. In step S90, an inspection signal (peak value: 100 V) is applied to the probe unit 400.

In the third embodiment as well, on the basis of the value of the time register t (as in the first embodiment) and a return signal $TM_{DET}$ of a signal BP (as in the second embodiment), a controller 500 can recognize the position of a BP on which the probe unit 400 is currently present. In step S92, it is checked whether the probe unit 400 is on a BP. If it is determined that the probe unit 400 is on a BP, a specific pad $BP_n$ on which the probe unit 400 is present is determined on the basis of an elapsed time t. In step S94, records 800 and 801 of the wiring information file corresponding to the pad $BP_n$ are read. In step S96, one or a plurality of PPs for which a discontinuity check is to be performed are specified on the basis of the contents of the record 801, and the signal PD at each PP is detected to perform a discontinuity check. In step S98, one or a plurality of pin pads PP for which a check on a short is to be performed are specified on the basis of the contents of the record 800, and the signal PD at each PP is detected to perform a check on a short.

As described above, the inspection apparatus of the third embodiment can perform detection of discontinuity in each interconnection and shorts between the interconnections with one wiping operation. In addition, since the voltage value of a signal to be applied to each BP is set to as high as 100 V, an increase in S/N ratio and formation of non-defective products can be attained at the same time.

Modification of Third Embodiment

Each comparator 710 used in the third embodiment needs to have a wide dynamic range for input signals. Such a comparator is expensive. Accordingly, a modification to the third embodiment is proposed as illustrated in FIG. 3.

The modification in FIG. 3 includes a comparator ($IC_1$) dedicated for discontinuity test and a comparator ($IC_3$) dedicated for insulation test that are provided separately. The outputs of the comparators $IC_1$ and $IC_3$ are inputted to driver gates 900a, 900b, respectively, which have a enable input terminal. An enabling signal which exhibits high level makes a level of an output of the comparator into a high impedance state, that means disabled state. The controller 500 can select either one of the comparators, that is, whether a discontinuity test or a insulation test should be performed, by controlling a value of the enabling signals.

At first, the operation of the circuit for discontinuity test is described. Where a board or circuit is under test does not include a discontinuity and when a voltage signal at 100V is applied via the probe 400, a voltage at 100V at most is detected at a resistor $R_4$ (100 KΩ) via the pin pad 101 and the pressing pin 231. The voltage is dropped by a resistor $R_3$ (18 KΩ), then cramped by a Zener diode $D_1$ into around 5.6V at an input terminal of the comparator $IC_1$. A threshold voltage $Th_1$ of the comparator $IC_1$ is determined so that it produces a high level signal when 5.6V is detected at the plus (+) terminal of the comparator $IC_1$.

If a pattern has a discontinuity or some resistance, the resistors $R_3$, $R_4$ apply a voltage less than 5.6V onto the plus (+) input of the comparator $IC_1$, which makes the output of the comparator $IC_1$ into low. Consequently, the discontinuity or half discontinued state is detected.

Next, the circuit for insufficient insulation (shortage test) according to the modification is described below.

Resistors $R_1$, $R_2$ form a dividing circuit, an integrated circuit $IC_2$ functions as an amplifier. In the insufficient insulation test, where a pattern has an insufficient insulation (less than 100 MΩ in insulation resistance) and even if 100 V which is comparatively high is applied via the probe 400, a voltage detected at the resistor R1 is very low. The amplifier $IC_2$ is thus required for amplifying the low voltage.

If the control procedure illustrated in FIG. 29 is applied to the modification, the control disables the comparator 900*a* while enabling 900*b* in step S96, and produces a result of the discontinuity test as signal PD. In step S98, the control enables the comparator 900*a* while disabling 900*b*, and produces a result of the insufficient insulation test as signal PD.

Further modification to the third embodiment will be proposed below.

Figure 30:
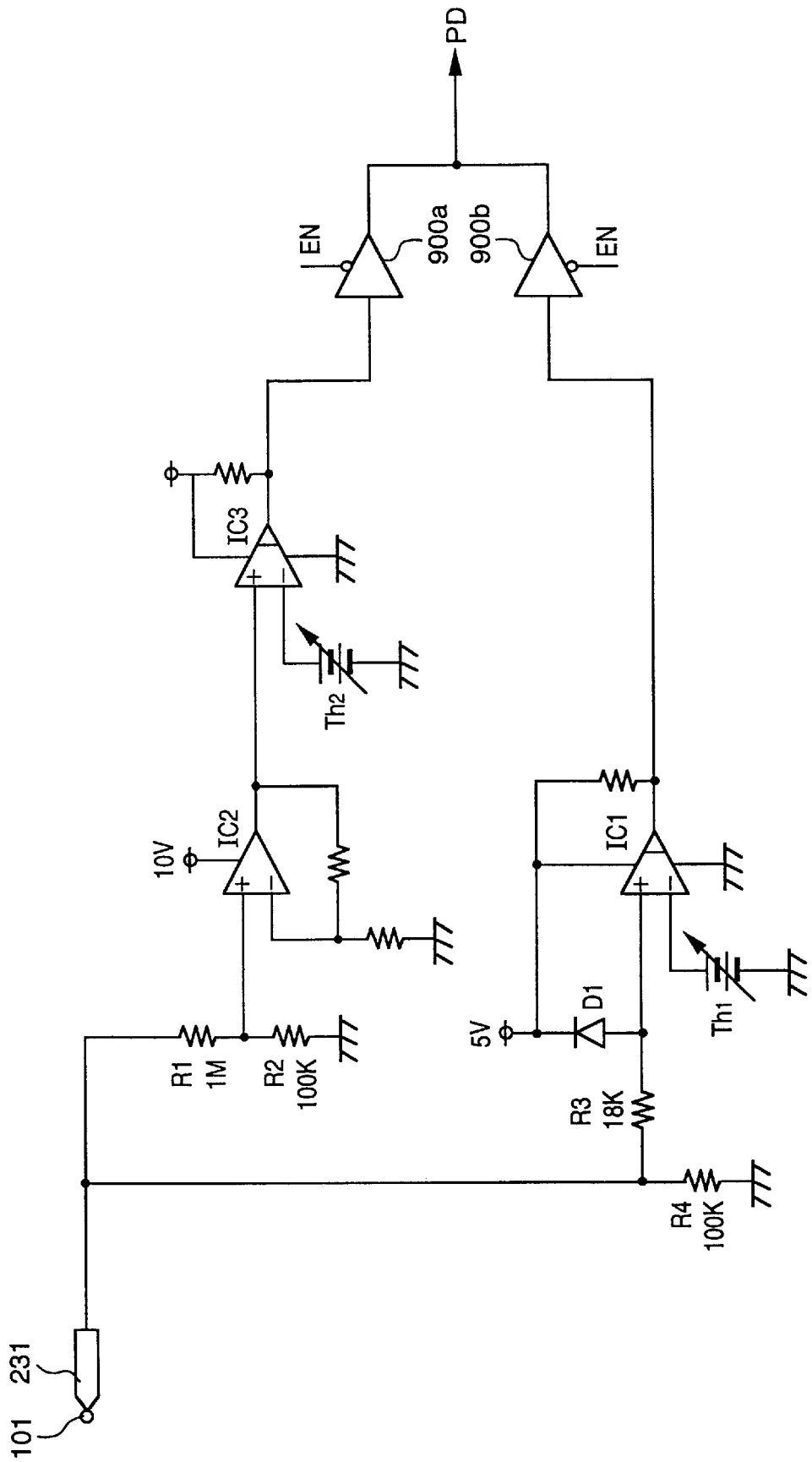
FIG. 30 is a circuit diagram showing the arrangement of a modification of the third embodiment.

The modified embodiment in FIG. 30 requires sampling one of the drivers 900*a* and 900*b*, because one signal PD is provided for each pin 231. Where the latches 512 (FIG. 25) has extra number of latches, the outputs of the drivers 900*a* and 900*b* may be connected to respective inputs of the latches. This will reduce a tact time by eliminating a time required for the sampling.

As many apparently widely different embodiments of the present invention can be made without departing from the spirit and scope thereof, it is to be understood that the invention is not limited to the specific embodiments thereof except as defined in the appended claims.

What is claimed is:

1. An inspection method of determining qualities of a plurality of conductive patterns on an electronic circuit board by applying a first electrical signal thereto through a first probe having a first contact pin, the electronic circuit board having a first group of plural terminals, a second group of plural terminals, and the plurality of conductive patterns for electrically connecting the first group of plural terminals to the second group of plural terminals, comprising:

a moving step of supplying the first electrical signal to said first probe through the first contact pin while moving said first probe and a second probe having a second contact pin along a straight line substantially constituted by the first group of plural terminals without separating distal ends of said probes from a surface of the electronic circuit board, the distance between said first contact pin and said second contact pin being set to be less than a width of the terminal;

a first detection step of detecting a second electrical signal appearing at each terminal of the second group of plural terminals while said first probe is supplying the first electrical signal to one terminal of the first group through the first contact pin;

a second detection step of detecting a third electrical signal at said second contact pin;

an identifying step of identifying a terminal, of the first group of plural terminals, to which the first electrical signal is supplied, on the basis of the third electrical signal obtained in the second detection step; and an evaluation step of evaluating a quality of a conductive pattern on the basis of the second electrical signal detected in the first detection step at one or a plurality of terminals of the second group which are connected to the terminal identified in the identifying step through conductive patterns.

2. The method according to claim 1, wherein an operation for identifying the terminal of the first group of plural terminals to which the first electrical signal is supplied in said identifying step, is initiated while said third electrical signal is detected as active.

3. The method according to claim 2, wherein the identifying step comprises identifying a terminal with which the first contact pin is in contact, on the basis of an elapsed time point from a start point of an inspection.

4. The method according to claim 2, wherein the moving step comprises moving said first probe at a constant velocity.

5. The method according to claim 2, wherein the first electrical signal has a known voltage value to be identifiable.

6. The method according to claim 2, wherein the first electrical signal has a known repetitive pattern to be identifiable.

7. The method according to claim 2, wherein the first detection step comprises sampling, as the second electrical signal, a detection signal which is detected a predetermined period of time after a time point at which an electrical signal detected at the second group of plural terminals greatly changes.

8. The method according to claim 2, wherein the moving step comprises pressing the first and second contact pins against the circuit board.

9. The method according to claim 1, further comprising the storage step of storing data in a predetermined memory, the data indicating a connection relationship between the first group of plural terminals and the second group of plural terminals through the plurality of conductive patterns, wherein the evaluation step comprises, when the third electrical signal is detected as active, specifying a terminal, of the second group, which is connected to the one terminal, on the basis of the predetermined memory, and determining a quality of a conductive pattern between said one terminal and the specified terminal on the basis of the second electrical signal detected in the first detection step.

10. The method according to claim 9, wherein the moving step comprises moving said first probe at a known velocity.

11. The method according to claim 9, further comprising the step of moving said first probe on a reference substrate having terminals and conductive patterns corresponding to the electronic circuit board at the known velocity; and the step of storing an electrical signal appearing at the second group of plural terminals as reference signal data in a predetermined second memory in a process in which said first probe is moved on the reference substrate, and wherein the second electrical signal obtained in the first detection step is compared with reference signal data read out from said second memory.

12. The method according to claim 11, wherein the evaluation step comprises retrieving target reference signal data from said second memory in accordance with an elapsed time.

13. The method according to claims 9, wherein the evaluation step comprises:

the step of detecting that the first contact pin of said first probe is in contact with one terminal of the first group;

the step of specifying a first terminal connected to said one terminal of the second group, and a second terminal which is not connected to said one terminal on the basis of the data indicating the connection relationship read out from said second memory;

the step of determining a discontinuity in a conductive pattern between said one terminal and the first terminal on the basis of the second electrical signal detected at the first terminal; and the step of determining a short in a conductive pattern between said one terminal and the second terminal on the basis of the second electrical signal detected at the second terminal.

14. The method according to claim 13, wherein the moving step comprises setting a voltage of the first electrical signal to a voltage for supplying a current large enough to burn off a conductive pattern in a semi-short state.

15. The method according to claim 9, wherein the first group of plural terminals are formed in a substantially straight line on the electronic circuit board, and the moving step comprises the step of specifying a start terminal of the first group of plural terminals, and the step of determining a direction which substantially coincides with an arranging direction of the first group of plural terminals as a moving direction on the basis of the specified start terminal.

16. The method according to claim 2, wherein the identifying step comprises:

the step of comparing an electrical signal applied to the first terminal at a given time point with a return signal detected through the second contact pin of said second probe at the given time point; and the step of recording a time at the given time point when the two signals substantially coincide with each other.

17. The method according to claim 9, wherein a time width within which electrical signals are picked up at all the second group of plural terminals in the detection step is set to be shorter than a time required for the first contact pin to pass through one terminal of the first group of plural terminals in the moving step.

18. The method according to claim 2, wherein the first and second contact pins are inclined with respect to the surface of the electronic circuit board, and the moving step comprises rotating a body of said first and second probes about an axis perpendicular to the surface of the electronic circuit board when a moving direction of said body is changed, thereby maintaining an azimuth angle of the first and second contact pins with respect to the surface.

* * * * *

UNITED STATES PATENT AND TRADEMARK OFFICE
CERTIFICATE OF CORRECTION

PATENT NO. : 6,160,409
DATED : December 12, 2000
INVENTOR(S) : Akira NURIOKA

Page 1 of 1

It is certified that error appears in the above-identified patent and that said Letters Patent is hereby corrected as shown below:

On title page,

[75] Residence of inventor is changed from "Fukyama, Japan" to --Fukuyama, Japan--

[56] First Reference cited is changed from 3,562,543" to --3,562,643--.

Signed and Sealed this

Fifth Day of June, 2001

*Attest:*

NICHOLAS P. GODICI

*Attesting Officer*

*Acting Director of the United States Patent and Trademark Office*

UNITED STATES PATENT AND TRADEMARK OFFICE
CERTIFICATE OF CORRECTION

PATENT NO. : 6,160,409
DATED : December 12, 2000
INVENTOR(S) : Akira Nurioka

It is certified that error appears in the above-identified patent and that said Letters Patent is hereby corrected as shown below:

Title page,
Please add Item [56]:

References Cited
FOREIGN PATENT DOCUMENTS
90 14 236.5    12/1990    Germany

Signed and Sealed this

Sixth Day of November, 2001

Attest:

NICHOLAS P. GODICI
Attesting Officer    Acting Director of the United States Patent and Trademark Office